(12) United States Patent
Otsuka et al.

(10) Patent No.: US 12,294,347 B2
(45) Date of Patent: May 6, 2025

(54) NOISE FILTER

(71) Applicant: Mitsubishi Electric Corporation, Tokyo (JP)

(72) Inventors: Kyota Otsuka, Tokyo (JP); Kenji Hirose, Tokyo (JP); Yoshihiro Akeboshi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 64 days.

(21) Appl. No.: 18/378,298

(22) Filed: Oct. 10, 2023

(65) Prior Publication Data
US 2024/0039502 A1  Feb. 1, 2024

Related U.S. Application Data

(63) Continuation of application No. PCT/JP2022/019214, filed on Apr. 28, 2022.

(30) Foreign Application Priority Data

May 7, 2021 (WO) .................. PCT/JP2021/017436

(51) Int. Cl.
*H03H 7/09* (2006.01)
*H02H 3/02* (2006.01)
(Continued)

(52) U.S. Cl.
CPC .............. *H03H 7/09* (2013.01); *H02H 3/023* (2013.01); *H02H 7/20* (2013.01); *H02H 7/26* (2013.01); *H03H 2001/0014* (2013.01)

(58) Field of Classification Search
CPC .. H03H 7/09; H03H 2001/0014; H02H 3/023; H02H 7/20; H02H 7/26
(Continued)

(56) References Cited

U.S. PATENT DOCUMENTS 5,619,079 A * 4/1997 Wiggins ............... H03H 1/0007
                                                        307/89
6,636,107 B2 * 10/2003 Pelly ....................... H02M 1/12
                                                        363/40
(Continued)

FOREIGN PATENT DOCUMENTS

| JP | 11-88096 A | 3/1999 |
| JP | 3401413 B2 | 4/2003 |
| JP | 5031444 B2 | 9/2012 |

OTHER PUBLICATIONS

International Search Report (PCT/ISA/210) issued in PCT/JP2022/019214, mailed on Jul. 19, 2022.

*Primary Examiner* — Alfonso Perez Borroto
(74) *Attorney, Agent, or Firm* — Birch, Stewart, Kolasch & Birch, LLP

(57) ABSTRACT

A noise filter includes: a ground-side power supply line detecting circuit that is connected to each of a power supply line and a power supply line and detects a power supply line connected to an electrode from among the power supply line and the power supply line; and a control circuit that determines whether the power supply line connected to the electrode is the power supply line or the power supply line on the basis of a detection result by the ground-side power supply line detecting circuit, controls a relay to short-circuit between a Y capacitor and an electrical device ground when determining that the power supply line connected to the electrode is the power supply line, and controls a relay to short-circuit between a Y capacitor and the electrical device ground when determining that the power supply line connected to the electrode is the power supply line.

12 Claims, 15 Drawing Sheets

(51) Int. Cl.
  *H02H 7/20*    (2006.01)
  *H02H 7/26*    (2006.01)
  *H03H 1/00*    (2006.01)

(58) Field of Classification Search
  USPC .......................................................... 307/100
  See application file for complete search history.

(56)            References Cited

U.S. PATENT DOCUMENTS

| 6,867,575 | B2* | 3/2005 | Jacob D'Cunha | H02M 1/44 |
| | | | | 363/44 |
| 8,115,457 | B2* | 2/2012 | Balakrishnan | H02M 1/32 |
| | | | | 320/166 |
| 10,177,646 | B2* | 1/2019 | Chung | H02M 1/12 |
| 2011/0025278 | A1* | 2/2011 | Balakrishnan | H02M 1/32 |
| | | | | 320/166 |
| 2013/0051081 | A1* | 2/2013 | Isono | H02M 1/126 |
| | | | | 399/88 |
| 2014/0140112 | A1* | 5/2014 | Zhou | H02M 1/126 |
| | | | | 363/39 |
| 2015/0364989 | A1* | 12/2015 | Chung | H02M 1/12 |
| | | | | 363/44 |
| 2016/0308399 | A1* | 10/2016 | Nakamura | B60L 53/122 |

* cited by examiner

NOISE FILTER

CROSS REFERENCE TO RELATED APPLICATIONS

This application is a Continuation of PCT International Application No. PCT/JP2022/019214 filed on Apr. 28, 2022, which claims priority under 35 U.S.C. 119(a) to PCT International Application No. PCT/JP2021/017436, filed in Japan on May 7, 2021, all of which are hereby expressly incorporated by reference into the present application.

TECHNICAL HELD

The present disclosure relates to a noise filter.

BACKGROUND ART

In an electrical device, a capacitor called a Y capacitor may be attached between a plurality of power supply lines each connected to any one of a plurality of electrodes of an AC power supply and a ground (Hereinafter referred to as an electrical device ground) attached to the electrical device. The Y capacitor functions as a noise filter circuit that reduces a common mode noise generated outside the electrical device and mixed in the electrical device using each electrode of the AC power supply, each power supply line, and the electrical device ground as paths in order.

Patent Literature 1 describes a noise suppression device installed in an electrical device. The noise suppression device includes two power supply lines, and one Y capacitor is disposed between the two power supply lines and the electrical device ground, in addition, in the noise suppression device, a changeover switch that switches connection to one of the two power supply lines is disposed between the two power supply lines and the one Y capacitor. Accordingly, the power supply line connected to the Y capacitor is switched. An AC power supply connected to the noise suppression device includes a ground-side electrode connected to the ground (Hereinafter, referred to as a power supply ground.) and a non-ground-side electrode not connected to the power supply ground.

Of the two power supply lines of the noise suppression device, which power supply line is connected to the ground-side electrode of the AC power supply and which power supply line is connected to the non-ground-side electrode of the AC power supply is not constant because it is determined by the direction in which the power supply plug, which is the terminal of the two power supply lines, is inserted into the outlet. Therefore, the above-described changeover switch is used to switch the power supply line connected to the Y capacitor.

CITATION LIST

Patent Literature

Patent Literature 1: Japanese Patent Laid-open Publication No. 11-88096

SUMMARY OF INVENTION

Technical Problem

In the noise suppression device of Patent Literature 1 when the power supply line to be connected to the Y capacitor is connected to the non-ground-side electrode of the AC power supply, a leakage current is generated by application of an AC voltage to the Y capacitor. Since the risk of electric shock to the human body occurs, the leakage current must be kept below a certain value. In this case, the noise suppression device can suppress the leakage current to a certain value or less by switching the power supply, line to be connected to the Y capacitor to the power supply line connected to the ground-side electrode. However, the noise suppression device of Patent Literature 1 does not have a specific configuration for switching the power supply line to be connected to the Y capacitor other than the above-described changeover switch, and there is a possibility that appropriate switching cannot be necessarily performed.

The present disclosure has been made to solve the above problem, and an object of the present disclosure is to provide a technique capable of appropriately switching a power supply line to be connected to a Y capacitor.

Solution to Problem

A noise filter according to the present disclosure is a noise filter of an electrical device connected to an AC power supply having a first electrode connected to a power supply ground and a second electrode not connected to the power supply ground, the noise filter including: a first power supply line connected to one of the first electrode and the second electrode; a second power supply line connected to the other of the first electrode and the second electrode; a first Y capacitor connected to the first power supply line; a second Y capacitor connected to the second power supply line; a first relay connected between the first Y capacitor and the electrical device ground; a second relay connected between the second Y capacitor and the electrical device ground, a ground-side power supply line detecting circuit that is connected to each of the first power supply line and the second power supply line, and detects a power supply line connected to the first electrode from among the first power supply line and the second power supply line; and a control circuit to determine whether a power supply line connected to the first electrode is the first power supply line or the second power supply line on a basis of a detection result by the ground-side power supply line detecting circuit, controls the first relay to short-circuit between the first Y capacitor and the electrical device ground when determining that the power supply line connected to the first electrode is the first power supply line, and controls the second relay to short-circuit between the second Y capacitor and the electrical device ground when determining that the power supply line connected to the first electrode is the second power supply line.

Advantageous Effects of Invention

According to the present disclosure, it is possible to appropriately switch the power supply line connected to the Y capacitor.

DESCRIPTION OF EMBODIMENTS

In order to explain the present disclosure in more detail, a mode for carrying out the present disclosure will be described below with reference to the accompanying drawings.

First Embodiment

Figure 1:
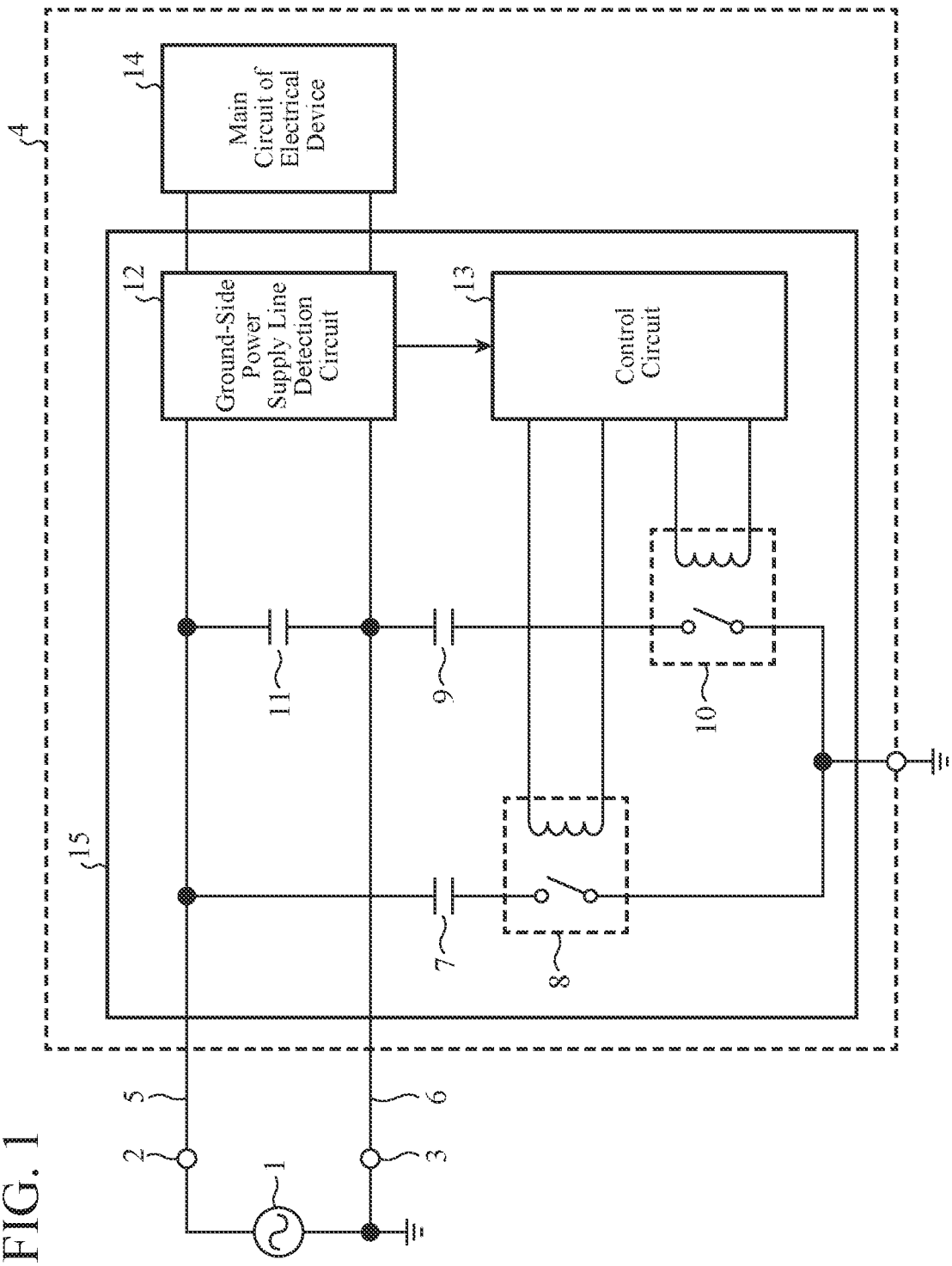
FIG. 1 is a block diagram illustrating a configuration of an electrical device according to a first embodiment.

FIG. 1 is a block diagram illustrating a configuration of an electrical device 4 according to a first embodiment. As illustrated in FIG. 1, the electrical device 4 includes a noise filter 15 and a main circuit 14 of the electrical device. The noise filter 15 includes a power supply line 5, a power supply line 6, a Y capacitor 7, a relay 8, a Y capacitor 9, a relay 10, an X capacitor 11, a ground-side power supply line detecting circuit 12, and a control circuit 13.

An AC power supply 1 to which an electrical device 4 is connected has an electrode 2 (second electrode) not connected to the power supply ground and an electrode 3 (first electrode) connected to the power supply ground. In the first embodiment, the AC power supply 1 is a single-phase two-wire power supply. The AC power supply 1 may include a transformer for transformation or the like. Note that, in the first embodiment, a configuration in which the AC power supply 1 is a single-phase two-wire power supply and includes two electrodes of the electrode 2 and the electrode 3 will be described. However, the AC power supply 1 only needs to include at least a plurality of electrodes and any one of the plurality of electrodes is connected to the power supply ground, and the number of electrodes included in the AC power supply 1 is not particularly limited.

The electrical device 4 is a device that operates with the AC power supply 1. A type of the electrical device 4 is not particularly limited.

Each of the power supply line 5 and the power supply line 6 (the first power supply line and the second power supply line) of the noise filter 15 is a conductive wire for connection to the AC power supply 1. The power supply line 5 is connected to one of the electrode 2 or the electrode 3. Note that, in FIG. 1, the power supply line 5 is connected to the electrode 2. The power supply line 6 is connected to the other of the electrode 2 and the electrode 3. That is, the power supply line 6 is connected to the other electrode different from the electrode to which the power supply line 5 is connected. Note that, in FIG. 1, the power supply line 6 is connected to the electrode 3.

Note that, in the first embodiment, a configuration in which the noise filter 15 includes two power supply lines, the power supply line 5 and the power supply line 6, will be described. However, the noise filter 15 may include three or more power supply lines. The noise filter 15 only needs to include at least the same number of power supply lines as the number of the plurality of electrodes included in the AC power supply 1.

The Y capacitor 7 (first Y capacitor or second Y capacitor) is connected to the power supply line 5, More specifically, the Y capacitor 7 is connected to one branch line of the branched power supply lines 5.

The relay 8 is connected between the Y capacitor 7 and the electrical device ground. That is, the Y capacitor 7 and the relay 8 are connected in series. The relay 8 short-circuits between the Y capacitor 7 and the electrical device ground or opens between the Y capacitor 7 and the electrical device ground. Note that, the relay 8 opens between the Y capacitor 7 and the electrical device ground until receiving an instruction from the control circuit 13 to be described later. That is, the relay 8 can short-circuit between the Y capacitor 7 and the electrical device ground only while the coil included in the relay 8 is energized.

The Y capacitor 9 (first Y capacitor or second Y capacitor) is connected to the power supply line 6. More specifically, the Y capacitor 9 is connected to one branch line of the branched power supply lines 6.

The relay 10 (first relay or second relay) is connected between the Y capacitor 9 and the electrical device ground. That is, the Y capacitor 9 and the relay 10 are connected in series. The relay 10 (first relay or second relay) short-circuits between the Y capacitor 9 and the electrical device ground or opens between the Y capacitor 9 and the electrical device ground. Note that the relay 10 opens between the Y capacitor 9 and the electrical device ground until receiving an instruction from the control circuit 13 to be described later. That is, the relay 10 can short-circuit between the Y capacitor 9 and the electrical device ground only while the coil included in relay 10 is energized.

More specifically, regarding the Y capacitor 7 and the Y capacitor 9, in a case where the capacitance value of each of the Y capacitor 7 and the Y capacitor 9 is C [F], the upper limit value of the leakage current in the noise filter 15 is [A] the angular frequency of the AC power supply 1 is co [rack], and the power supply voltage of the AC power supply 1 is V [V], the capacitance value C [F] of each of the Y capacitor 7 and the Y capacitor 9 follows the following Formula. (1).

$$C \geq \frac{I}{\omega \times V} \quad (1)$$

However, the upper limit value of the leakage current in the noise filter 15 and the power supply voltage of the AC power supply 1 are each an effective value. For example, when the upper limit value of the leakage current in the noise filter 15 is 1 mA, the angular frequency of the AC power supply 1 is 2π×50 Hz [rack], and the power supply voltage of the AC power supply 1 is 100 V, each of the capacitance values of the Y capacitor 7 and the V capacitor 9 is equal to or more than 31.8 nF. However, in a case where there is a factor that generates a leakage current in addition to the Y capacitor 7 and the Y capacitor 9, or in a case where a leakage current is generated by applying a voltage having an angular frequency other than the angular frequency of the AC power supply 1 to the Y capacitor 7 and the Y capacitor 9, it is necessary to lower the upper limit value of the leakage current in the noise filter 15.

Note that, in the first embodiment, a configuration in which the noise filter 15 includes two V capacitors of the Y capacitor 7 and the Y capacitor 9 and two relays of the relay 8 and the relay 10 will be described, but the noise filter 15 may include three or more Y capacitors and three or more relays. The noise filter 15 only needs to include at least the same number of Y capacitors and relays as the number of the plurality of electrodes included in the AC power supply 1.

The X capacitor 11 is connected between the power supply line 5 and the power supply line 6. More specifically, the X capacitor 11 is connected between the other branch line of the branched power supply lines 5 and the branch point of the branched power supply line 6.

The ground-side power supply line detecting circuit 12 is connected to each of the power supply line 5 and the power supply line 6. More specifically, the ground-side power supply line detecting circuit 12 is connected to each of the other branch line of the branched power supply lines 5 and the other branch line of the branched power supply lines 6. The ground-side power supply line detecting circuit 12 detects a power supply line (ground-side power supply line connected to the electrode 3 from among the power supply line 5 and the power supply line 6. For example, the ground-side power supply line detecting circuit 12 detects the voltage of the power supply line connected to the electrode 3.

The control circuit 13 is connected to each of the relay 8, the relay 10, and the ground-side power supply line detecting circuit 12. The control circuit 13 determines whether the power supply line connected to the electrode 3 is the power supply line 5 or the power supply line 6 on the basis of the detection result by the ground-side power supply line detecting circuit 12. When determining that the power supply line connected to the electrode 3 is the power supply line 5, the control circuit 13 controls the relay 8 to short-circuit between the Y capacitor 7 and the electrical device ground. On the other hand, when determining that the power supply line connected to the electrode 3 is the power supply line 6, the control circuit 13 controls the relay 10 to short-circuit between the Y capacitor 9 and the electrical device ground.

The main circuit 14 of the electrical device includes all the circuits necessary for the operation and the like of the electrical device 4 other than the circuit of the noise filter 15 described above.

Figure 2:
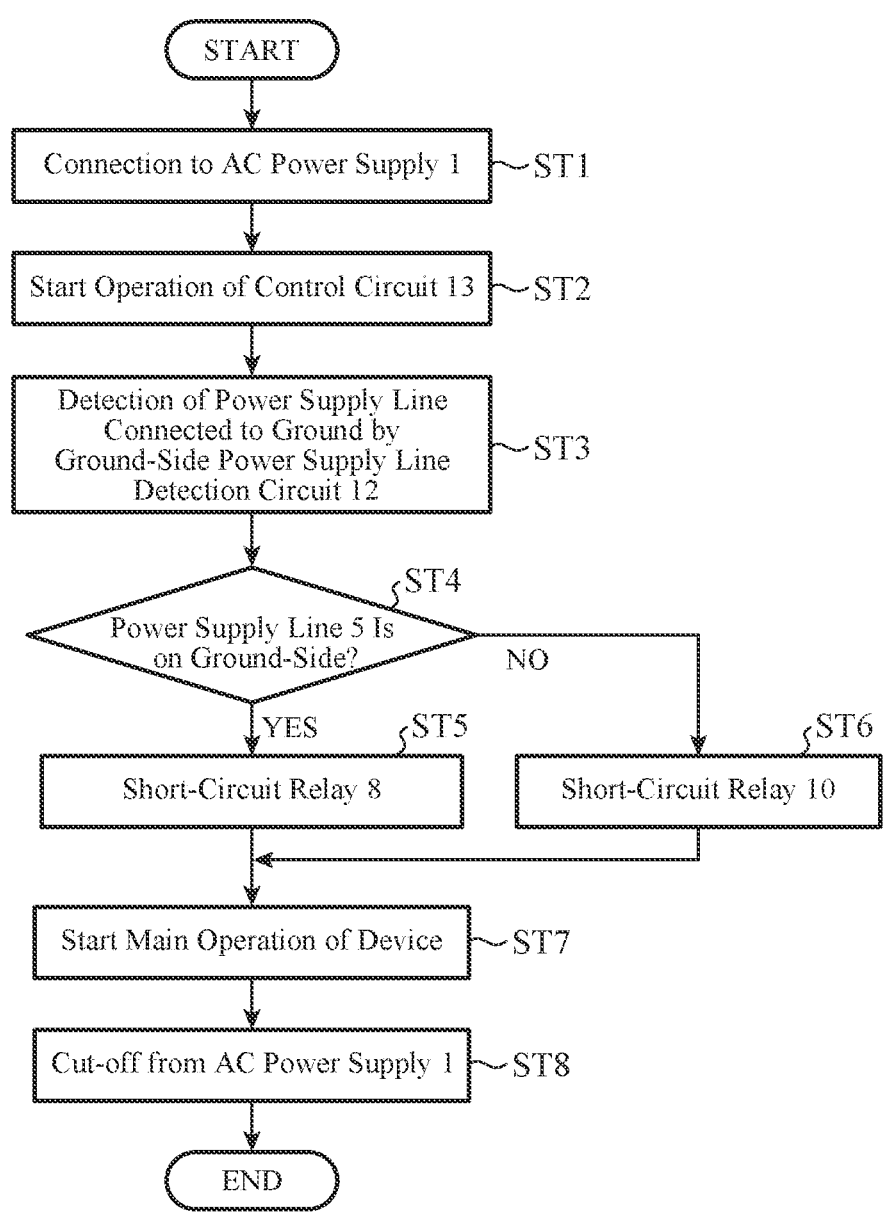
FIG. 2 is a flowchart illustrating a power supply line switching method by a noise fitter according to the first embodiment.

Hereinafter, the operation of the noise filter 15 according to the first embodiment will be described with reference to the drawings. FIG. 2 is a flowchart illustrating a power supply line switching method by the noise filter 15 according to the first embodiment.

As illustrated in FIG. 2, the power supply line 5 is connected to one of the electrode 2 and the electrode 3, and the power supply line 6 is connected to the other of the electrode 2 and the electrode 3 (step ST1).

Next, the control circuit 13 starts the operation (step ST2). Note that, at this point, the circuit operation in which the large noise is generated is not started.

Next, the ground-side power supply line detecting circuit 12 detects the power supply line connected to the electrode 3 from among the power supply line 5 and the power supply line 6 (step ST3). The ground-side power supply line detecting circuit 12 outputs a detection result to the control circuit 13.

Next, the control circuit 13 determines whether or not the power supply line 5 is a power supply line (a ground-side power supply line) connected to the electrode 3 on the basis of the detection result of the ground-side power supply line detecting circuit 12 (step ST4).

When determining that the power supply line 5 is the power supply line connected to the electrode 3 (YES in step ST4), the control circuit 13 controls the relay 8 to short-circuit between the Y capacitor 7 and the electrical device ground (step ST5).

When determining that the power supply line 5 is not the power supply line connected to the electrode 3 (NO in step ST4), the control circuit 13 controls the relay to short-circuit between the Y capacitor 9 and the electrical device ground (step ST6). Note that, in the example of FIG. 1, since the power supply line 5 is not a power supply line connected to the electrode 3, the control circuit 13 controls the relay 10 to short-circuit between the Y capacitor 9 and the electrical device ground.

As the next step of step ST5 or step ST6, the main circuit 14 of the electrical device starts a circuit operation (main operation of the electrical device 4) in which relatively large noise is generated (step ST7).

Next, the main circuit 14 of the electrical device is cut off from the AC power supply 1 to stop the main operation of the electrical device 4 (step ST8). At this time, since the energization to the coil included in the relay 8 or the relay 10 is stopped, the connection between the Y capacitor 7 or the Y capacitor 9 and the electrical device ground is released.

The following effects can be obtained by the components and the operation of the noise filter 15 according to the first embodiment described above.

(Effect 1)

By operating the noise filter 15 as described above, the Y capacitor is connected only between the ground-side power supply line connected to the power supply ground via the electrode 3 of the AC power supply 1 and the electrical device ground, and is not connected between the non-ground-side power supply line not connected to the power supply ground and the electrical device ground. The voltage fluctuation between the power supply line and the electrical device ground at the frequency of the AC power supply 1 is smaller in the ground-side power supply line than in the non-ground-side power supply line. Therefore, for example, in a configuration in which the Y capacitor is attached to all the power supply lines, the Y capacitor is also connected to the nota-ground-side power supply line having a larger voltage fluctuation than the ground-side power supply line, so that the leakage current increases. On the other hand, in the noise filter 15 according to the first embodiment, since the Y capacitor can be connected only to the ground-side power supply line side where the voltage fluctuation is smaller than that of the non-ground-side power supply line, the leakage current can be greatly reduced.
(Effect 2)

The noise filter 15 according to the first embodiment adopts a configuration in which the ground-side power supply line detecting circuit 12 and the control circuit 13 detect the power supply line connected to the power supply ground, acid switch the connection destination of the Y capacitor on the basis of the detection result. As a result, even in a case where the noise filter 15 is applied to an electrical device in which a power supply line is not necessarily connected to a fixed terminal, such as using an outlet plug for connection to the AC power supply 1, a connection destination of the Y capacitor can be appropriately selected.
(Effect 3)

In the noise filter 15 according to the first embodiment, since the Y capacitor is connected to the ground-side power supply line, the impedance between the ground-side power supply line and the electrical device ground can be reduced. Further, since the X capacitor is connected between the power supply lines, the non-ground-side power supply line is also connected to the Y capacitor via the X capacitor. Therefore, the impedance between the non-ground-side power supply line and the ground can be reduced. As a result, the common mode noise can be reduced without connecting the Y capacitor to all the power supply lines.
(Effect 4)

The common mode noise includes a wide frequency band component, but it is effective to increase the capacitance value of the Y capacitor in order to reduce a low frequency component. In addition, an increase in the number of windings of the common mode choke coil, a change in the core material, or the like is effective. In order to reduce the common mode noise of a relatively low frequency, when the capacitance value of the Y capacitor is increased, the leakage current also increases. Therefore, there is an upper limit to increase the capacitance value. In addition, in the conventional noise filter in which the common mode choke coil in which the windings are increased is disposed, there is a problem that the component cost is increased. However, in the noise filter 15 according to the first embodiment, as described in (Effect 1), the voltage fluctuation between the power supply line and the electrical device ground at the frequency of the AC power supply 1 is smaller in the ground-side power supply line than in the non-ground-side power supply line. Therefore, even if the capacitance value of the Y capacitor is made larger than the capacitance value of the conventional Y capacitor, the capacitance value can be suppressed to be within the upper limit value of the leakage current, and the common mode noise having a frequency lower than that of the conventional Y capacitor can be reduced. Furthermore, since the component cost required for the common mode choke coil and the like can be reduced, the cost of the entire noise filter can be reduced.
(Effect 5)

After the connection between the Y capacitor and the electrical device ground is completed, the circuit operation in which relatively large noise is generated is started. As a result, the amount of common mode noise generated can be suppressed even until the Y capacitor and the electrical device ground are connected.

The representative embodiment of the noise filter 15 has been described above. The noise filter 15 is applicable not only to a single-phase AC power supply but also to a three-phase AC power supply. A common mode noise choke coil, a capacitor, a surge protection element, a relay for cutting off power, a fuse, or the like may be inserted into the circuit of the noise filter 15 described above. The connection of the Y capacitor to the electrical device ground may be made via a metal housing or the like of the electrical device 4. As a relay for connecting the Y capacitor to the electrical device ground, not only a mechanical relay but also a semiconductor relay, a transistor, or the like may be used. A latch type may be used as a relay for connecting the Y capacitor to the electrical device ground. However, in this case, all the Y capacitors need to be disconnected from the electrical device ground when the power is turned on. When the reduction amount of the common mode noise is sufficient, the capacitance value of the Y capacitor may be made smaller than the capacitance value indicated by Formula (1). After the ground-side power supply line is detected, the ground-side power supply line detecting circuit 12 may be disconnected from the power supply line and the electrical device ground.

As described above, the noise filter 15 according to the first embodiment is the noise filter 15 of the electrical device 4 connected to the AC power supply 1 having the electrode 3 connected to the power supply ground and the electrode 2 not connected to the power supply ground, the noise filter including: the power supply line 5 connected to one of the electrode 2 and the electrode 3; the power supply line 6 connected to the other of the electrode 2 and the electrode 3; the Y capacitor 7 connected to the power supply line 5; the Y capacitor 9 connected to the power supply line 6; the relay 8 connected between the Y capacitor 7 and the electrical device ground; the relay 10 connected between the Y capacitor 9 and the electrical device ground; the ground-side power supply line detecting circuit 12 that is connected to each of the power supply line and the power supply line 6, and detects a power supply line connected to the electrode 3 from among the power supply line 5 and the power supply line 6; and the control circuit 13 to determine whether the power supply line connected to the electrode 3 is the power supply line 5 or the power supply line 6 on the basis of a detection result by the ground-side power supply line detecting circuit 12, controls the relay 8 to short-circuit between the Y capacitor 7 and the electrical device ground when determining that the power supply line connected to the electrode 3 is the power supply line 5, and controls the relay 10 to short-circuit between the Y capacitor 9 and the electrical device ground when determining that the power supply line connected to the electrode 3 is the power supply line 6.

According to the above configuration, the power supply line connected to the electrode 3 is detected from among the power supply line 5 and the power supply line 6, whether the power supply line connected to the electrode 3 is the power supply line 5 or the power supply line 6 is determined on the basis of the detection result, and control is performed so as to short-circuit between the Y capacitor connected to the power supply line determined as the power supply line connected to the electrode 3 and the electrical device ground. As a result, the common mode noise can be reduced by connecting the power supply ground, the power supply line, the Y capacitor, and the electrical device ground, but since the power supply line not connected to the power supply ground is not connected to the Y capacitor, a leakage current is not generated. That is, the power supply line connected to the Y capacitor can be appropriately switched.

In the noise filter 15 according to the first embodiment, in a case where the capacitance value of each of the Y capacitor 7 and the Y capacitor 9 is C [F], the upper limit value of the leakage current in the noise filter 15 is I [A], the angular frequency of the AC power supply 1 is ω [rad/s], and the power supply voltage of the AC power supply 1 is V [V], the capacitance value C [F] of each of the Y capacitor 7 and the Y capacitor 9 follows the above-described Formula (1).

According to the above configuration, it is possible to suitably suppress the leakage current while suitably reducing the common mode noise.

Second Embodiment

In the first embodiment, the configuration in which the ground-side power supply line detecting circuit 12 detects the ground-side power supply line has been described. In a second embodiment, a configuration in which an A/D converter (analog-to-digital converter) detects a ground-side power supply line will be described.

The second embodiment will be described below by referring to the drawings. Note that, the same reference numerals are given to the components having the same functions as those described in the first embodiment, and the description thereof will be omitted.

Figure 3:
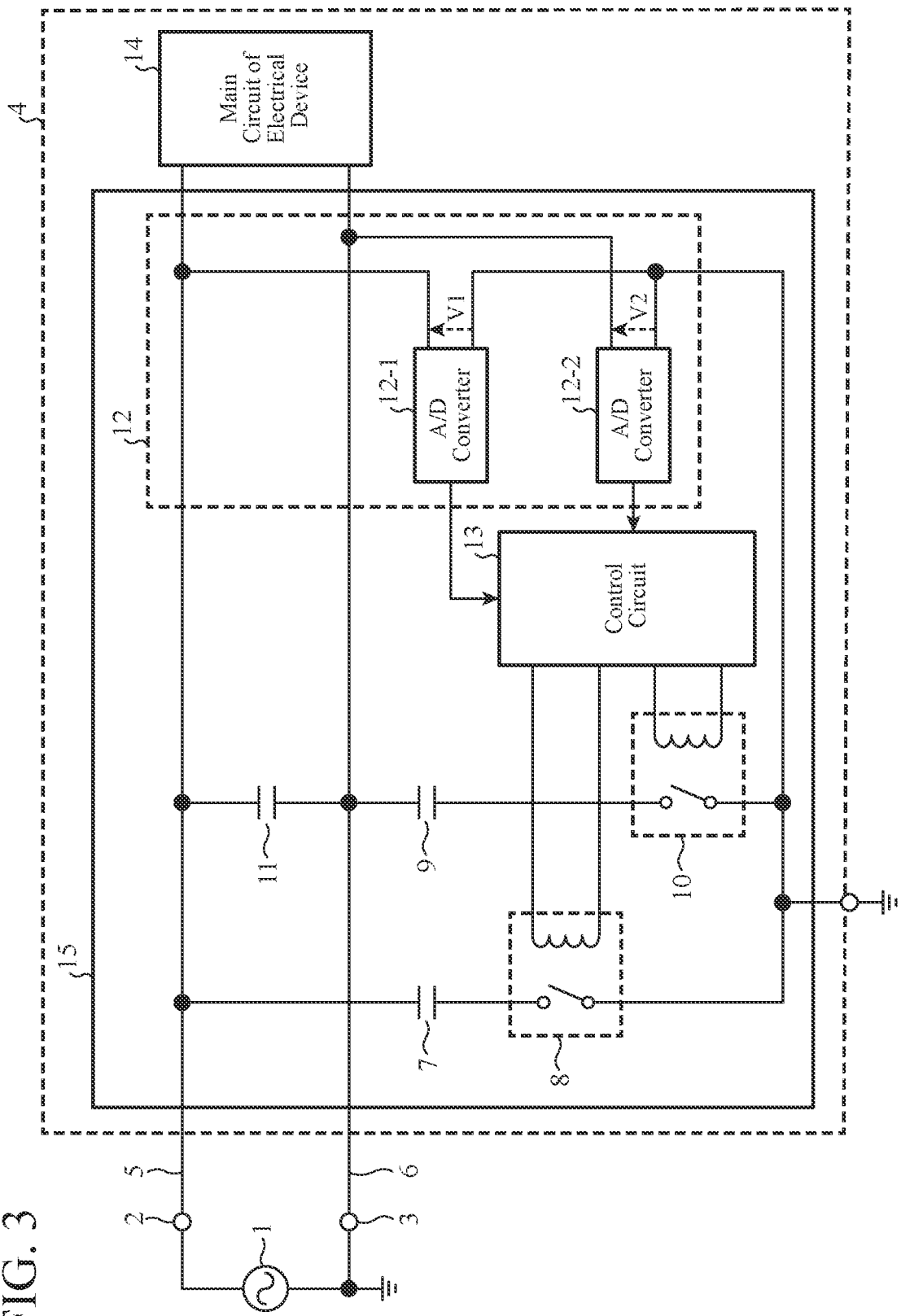
FIG. 3 is a block diagram illustrating a configuration of an electrical device according to a second embodiment.

FIG. 3 is a block diagram illustrating a configuration of an electrical device 4 according to the second embodiment. As illustrated in FIG. 3, a ground-side power supply line detecting circuit 12 of a noise filter 15 included in the electrical device 4 includes an A/D converter 12-1 and an A/D converter 12-2 (first analog-to-digital converter and second analog-to-digital converter). The A/D converter 12-1 has input terminals connected to the power supply line 5 and the electrical device ground, and an output terminal connected to the control circuit 13, The A/D converter 12-2 has input terminals connected to the power supply line 6 and the electrical device ground, and an output terminal connected to the control circuit 13.

The ground-side power supply line detecting circuit 12 according to the second embodiment detects a voltage V1 between the power supply line 5 and the electrical device ground, and detects a voltage V2 between the power supply line 6 and the electrical device ground. More specifically, in the second embodiment, in the ground-side power supply line detecting circuit 12, the A/D converter 12-1 detects the voltage V1 between the power supply line 5 and the electrical device ground, and the A/D converter 12-2 detects the voltage V2 between the power supply line 6 and the electrical device ground. The A/D converter 12-1 converts the detected voltage V1 into a digital signal and outputs the digital signal to the control circuit 13. The A/D converter 12-2 converts the detected voltage V2 into a digital signal and outputs the digital signal to the control circuit 13.

The control circuit 13 according to the second embodiment determines which of the amplitude of voltage V1 and the amplitude of voltage V2 detected by the ground-side power supply line detecting circuit 12 is smaller to determine whether the power supply line (ground-side power supply line) connected to the electrode 3 is the power supply line 5 or the power supply line 6. More specifically, in the second embodiment, the control circuit 13 determines which of the amplitude of voltage V1 detected by the A/D converter 12-1 and the amplitude of voltage V2 detected by the A/D converter 12-2 is smaller to determine whether the power supply line connected to the electrode 3 is the power supply line 5 or the power supply line 6.

When determining that the amplitude of voltage V1 is smaller than the amplitude of voltage V2, the control circuit 13 controls the relay 8 to short-circuit between the Y capacitor 7 and the electrical device ground. When determining that the amplitude of voltage V2 is smaller than the amplitude of voltage V1, the control circuit 13 controls the relay 10 to short-circuit between the Y capacitor 9 and the electrical device ground.

Figure 4:
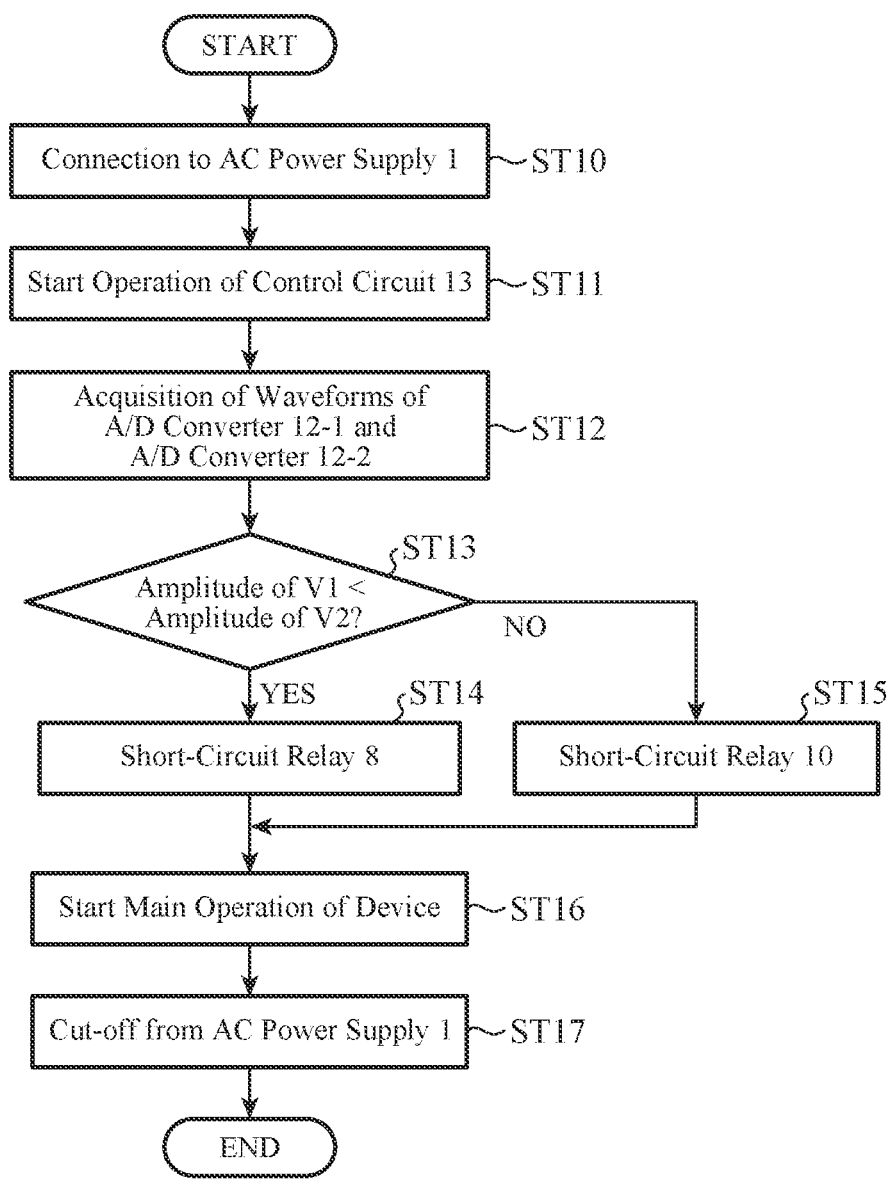
FIG. 4 is a flowchart illustrating a power supply line switching method by a noise filter according to the second embodiment.

Hereinafter, the operation of the noise filter 15 according to the second embodiment will be described with reference to the drawings. FIG. 4 is a flowchart illustrating a power supply line switching method by the noise filter 15 according to the second embodiment.

As illustrated in FIG. 4, the power supply line 5 is connected to one of the electrode 2 and the electrode 3, and the power supply line 6 is connected to the other of the electrode 2 and the electrode 3 (step ST10).

Next, the control circuit 13 starts the operation (step ST11).

Next, the A/D converter 12-1 detects a waveform of the voltage V1 between the power supply line 5 and the electrical device ground, and the A/D converter 12-2 detects a waveform of the voltage V2 between the power supply line 6 and the electrical device ground (step ST12). The A/D converter 12-1 converts the detected voltage V1 into a digital signal and outputs the digital signal to the control circuit 13. The A/D converter 12-2 converts the detected voltage V2 into a digital signal and outputs the digital signal to the control circuit 13.

Next, the control circuit 13 determines whether or not the amplitude of voltage V1 detected by the A/D converter 12-1 is smaller than the amplitude of voltage V2 detected by the A/D converter 12-2 (step ST13).

When determining that the amplitude of voltage V1 detected by the A/D converter 12-1 is smaller than the amplitude of voltage V2 detected by the A/D converter 12-2 (YES in step ST13), the control circuit 13 controls the relay 8 to short-circuit between the Y capacitor 7 and the electrical device ground (step ST14).

When determining that the amplitude of voltage V2 detected by the A/D converter 12-2 is smaller than the amplitude of voltage V1 detected by the A/D converter 12-1 (NO in step ST13), the control circuit 13 controls the relay 10 to short-circuit between the Y capacitor 9 and the electrical device ground (step ST15).

As the next step of step ST14 or step ST15, the main circuit 14 of the electrical device starts the main operation of the electrical device 4 (step ST16).

Next, the main circuit 14 of the electrical device is cut off from the AC power supply 1 to stop the main operation of the electrical device 4 (step ST17). At this time, since the energization to the coil included in the relay 8 or the relay 10 is stopped, the connection between the Y capacitor 7 or the Y capacitor 9 and the electrical device ground is released.

The following effects can be obtained by the components and the operation of the noise filter 15 according to the first embodiment described above.

(Effect 1)

By using the A/D converter for the ground-side power supply line detecting circuit 12, the noise filter 15 can be implemented by a simple circuit.

(Effect 2)

By using the A/D converter for the ground-side power supply line detecting circuit 12, the timing of zero crossing can be detected on the basis of the waveform obtained from the A/D converter.

The representative embodiment of the noise filter 15 has been described above. In addition to the configuration of the first embodiment and the configuration of the second embodiment, the following configuration may be further adopted. For example, a capacitor may be inserted between each A/D converter and the electrical device ground for the purpose of insulation or the like. The input unit of the A/D converter may be protected by a resistance voltage divider, a surge protection element, a diode, or the like. As the A/D converter, one built in the control circuit 13 may be used. In the second embodiment, the voltage is detected by the A/D converter. Alternatively, a resistor may be attached to the input unit to detect the current. In this case, the control circuit 13 may determine whether the power supply line connected to the electrode 3 is the power supply line 5 or the power supply line 6 on the basis of the detected current.

As described above, the ground-side power supply line detecting circuit 12 in the noise filter 15 according to the second embodiment detects the voltage V1 between the power supply line 5 and the electrical device ground and detects the voltage V2 between the power supply line 6 and the electrical device ground, and the control circuit 13 determines whether the power supply line connected to the electrode 3 is the power supply line 5 or the power supply line 6 by determining which of the amplitude of voltage V1 and the amplitude of voltage V2 detected by the ground-side power supply line detecting circuit 12 is smaller, controls the relay 8 to short-circuit between the Y capacitor 7 and the electrical device ground when determining that the amplitude of voltage V1 is smaller than the amplitude of voltage V2, and controls the relay 10 to short-circuit between the Y capacitor 9 and the electrical device ground when determining that the amplitude of voltage V2 is smaller than the amplitude of voltage V1.

According to the above configuration, it is possible to suitably determine whether the power supply line connected to the electrode 3 is the power supply line 5 or the power supply line 6 on the basis of the detected voltage. As a result, it is possible to short-circuit between the Y capacitor connected to the power supply line determined as the power supply line connected to the electrode 3 and the electrical device ground. That is, the power supply line connected to the Y capacitor can be appropriately switched.

The ground-side power supply line detecting circuit 12 in the noise filter 15 according to the second embodiment includes the A/D converter 12-1 that detects a voltage between the power supply line 5 and the electrical device ground, and the A/D converter 12-2 that detects a voltage between the power supply line 6 and the electrical device ground.

According to the above configuration, the voltage between the power supply line and the electrical device ground can be suitably detected. Then, on the basis of the detected voltage, it is possible to suitably determine whether the power supply line connected to the electrode 3 is the power supply line 5 or the power supply line 6. As a result, it is possible to short-circuit between the Y capacitor connected to the power supply line determined as the power supply line connected to the electrode 3 and the electrical device ground. That is, the power supply line connected to the Y capacitor can be appropriately switched.

Third Embodiment

In the first and second embodiments, the timing at which the relay short-circuits between the Y capacitor and the electrical device ground is not specified. However, in a third embodiment, a configuration will be described in which the relay short-circuits between the Y capacitor and the electrical device ground simultaneously with the timing at which the voltage between the power supply line and the electrical device ground reaches zero (timing of zero crossing). Note that, also in the third embodiment, description will be made using a noise filter 15.

When determining that the power supply line connected to the electrode 3 is the power supply line 5, a control circuit 13 according to the third embodiment controls the relay 8 to short-circuit between the Y capacitor 7 and the electrical device ground at a timing when the voltage V1 detected by a ground-side power supply line detecting circuit 12 reaches zero. When determining that the power supply line connected to the electrode 3 is the power supply line 6, the control circuit 13 controls the relay 10 to short-circuit between the Y capacitor 9 and the electrical device ground at a timing when the voltage V2 detected by the ground-side power supply line detecting circuit 12 reaches zero.

More specifically, in the third embodiment, when determining that the power supply line connected to the electrode 3 is the power supply line 5, the control circuit 13 controls the relay 8 to short-circuit between the Y capacitor 7 and the electrical device ground at a timing when the voltage V1 detected by the A/D converter 12-1 reaches zero. When determining that the power supply line connected to the electrode 3 is the power supply line 6, the control circuit 13 controls the relay 10 to short-circuit between the Y capacitor 9 and the electrical device ground at a timing when the voltage V2 detected by the A/D converter 12-2 reaches zero.

Hereinafter, a specific example of a power supply line switching method by the noise filter 15 according to the third embodiment will be described. In the specific example, a case where the control circuit 13 determines that the power supply line (ground-side power supply) connected to the electrode 3 is the power supply line 6 in the noise filter 15 according to the second embodiment will be described as an example. Note that the noise filter 15 according to the first embodiment can also be implemented as long as the zero crossing detection is possible.

Figure 5:
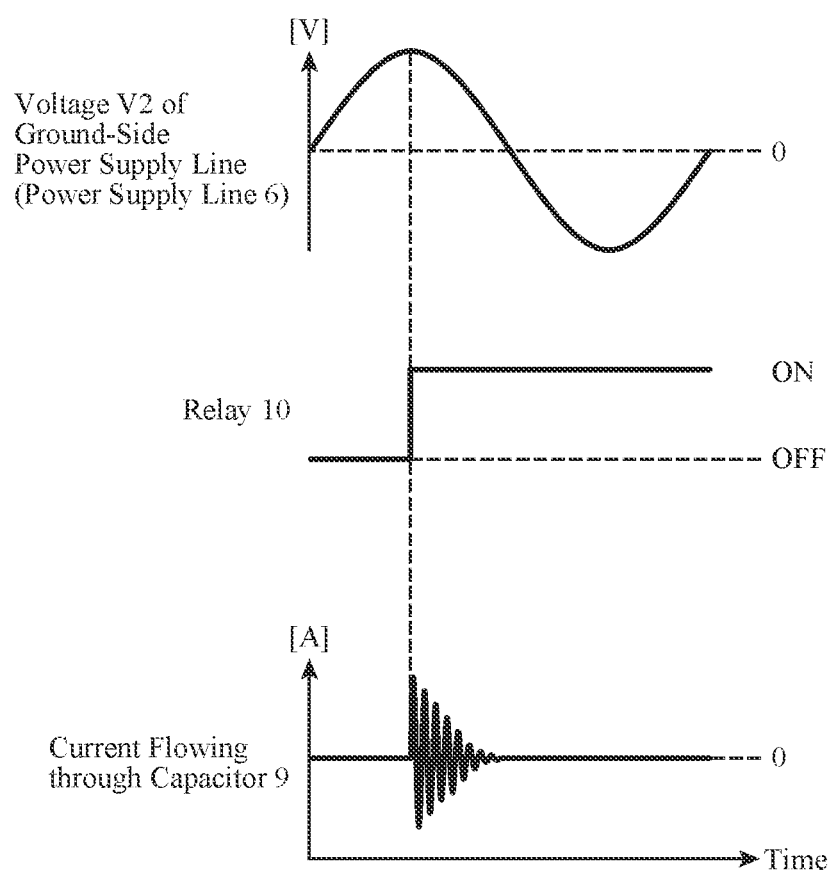
FIG. 5 is a graph showing a voltage detected by an A/D converter, the operation of a relay, and a current flowing through a Y capacitor in a configuration different from a configuration of a third embodiment.

For comparison, first, a configuration in which the control circuit 13 controls the relay 10 to short-circuit between the Y capacitor 9 and the electrical device ground at a timing different from the timing at which the voltage V2 detected by the A/D converter 12-2 reaches zero will be described. FIG. 5 is a graph illustrating the voltage V2 detected by the A/D converter 12-2, the operation of the relay 10, and the current flowing through the Y capacitor 9 in the configuration.

As illustrated in the upper graph of FIG. 5, due to parasitic inductance or the like of the power supply line 6, a slight voltage is also generated between the power supply line 6 and the electrical device ground. As illustrated in the middle graph of FIG. 5, the relay 10 short-circuits between the Y capacitor 9 and the electrical device ground at a timing when the voltage V2 of the power supply line 6 reaches maximum. As illustrated in the lower graph of FIG. 5, in this case, a voltage is instantaneously applied to the Y capacitor 9, and a current rapidly flows.

Figure 6:
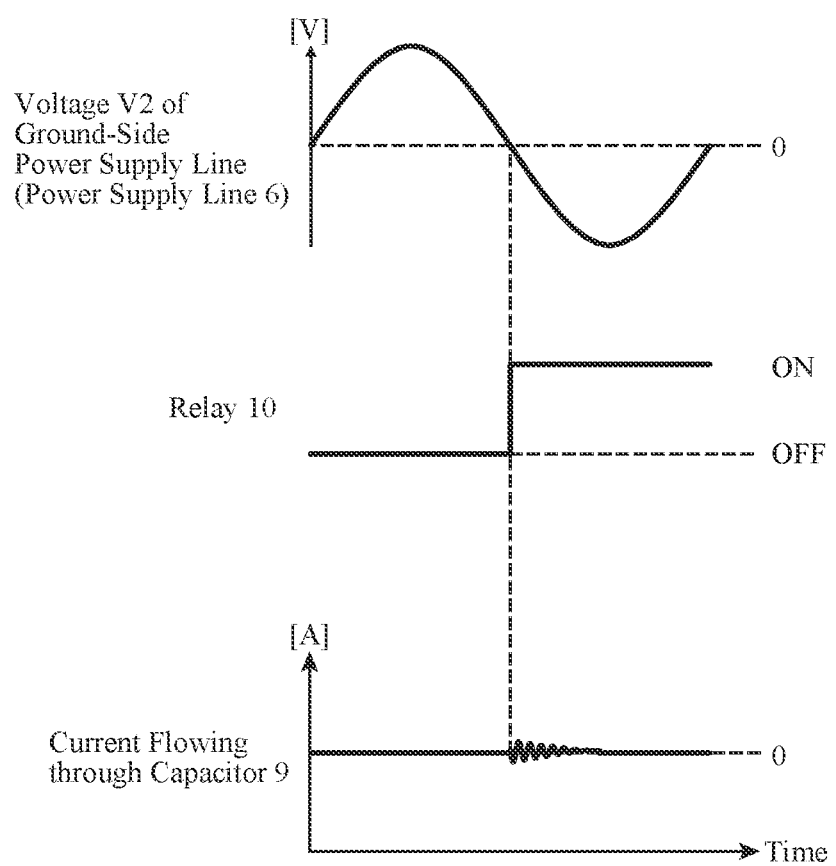
FIG. 6 is a graph showing a voltage detected by an A/D converter, the operation of a relay, and a current flowing through a Y capacitor in a configuration of the third embodiment.

Next, a configuration in which the control circuit 13 controls the relay 10 to short-circuit the Y capacitor 9 and the electrical device ground at a timing when the voltage V2 detected by the ground-side power supply line detecting circuit 12 reaches zero will be described. FIG. 6 is a graph illustrating the voltage V2 detected by the ground-side power supply line detecting circuit 12, the operation of the relay 10, and the current flowing through the Y capacitor 9 in the configuration.

As illustrated in the upper and middle graphs of FIG. 6, the relay 10 short-circuits between the Y capacitor 9 and the electrical device ground at a timing when the voltage V2 of the power supply line 6 reaches zero. As illustrated in the lower part of FIG. 6, in this case, the voltage application to the Y capacitor 9 becomes gentle, and the current is reduced.

As described above, in the third embodiment, the configuration has been described in which the relay 10 short-circuits between the Y capacitor 9 and the electrical device ground in accordance with the timing of zero crossing obtained from the voltage waveform and the like obtained from the A/D converter 12-2. Note that, the same applies to a case where the power supply line 5 is a ground-side power supply line.

The following effect can be obtained by the operation of the noise filter 15 according to the third embodiment described above.

(Effect 1)

At the timing when the voltage of the power supply line reaches zero, the relay corresponding to the power supply line short-circuits between the Y capacitor and the electrical device ground, so that the current does not rapidly flow to the Y capacitor, and noise generation can be prevented.

The representative embodiment of the noise filter 15 has been described above. In addition to the configuration of the first embodiment and the configuration of the second embodiment, the following configuration may be further adopted. In consideration of the delay of the A/D converter, the control circuit, the transmission line, and the like, the timing at which the relay short-circuits between the Y capacitor and the electrical device ground may be made before or after the timing at which the voltage of the power supply line reaches zero. Alternatively, a detection circuit that detects a timing at which the voltage of the power supply line reaches zero may be provided, and the relay may short-circuit between the Y capacitor and the electrical device ground depending on a signal of the detection circuit.

As described above, when determining that the power supply line connected to the electrode 3 is the power supply line 5, the control circuit 13 in the noise filter 15 according to the third embodiment controls the relay 8 to short-circuit between the Y capacitor 7 and the electrical device ground at the timing when the voltage V1 detected by the ground-side power supply line detecting circuit 12 reaches zero, and when determining that the power supply line connected to the electrode 3 is the power supply line 6, the relay 10 short-circuits between the Y capacitor 9 and the electrical device ground at the timing when the voltage V2 detected by the ground-side power supply line detecting circuit 12 reaches zero.

According to the above configuration, the relay corresponding to the power supply line short-circuits between the Y capacitor and the electrical device ground at the timing when the voltage of the power supply line reaches zero, so that the current does not rapidly flow to the Y capacitor, and noise generation can be prevented.

Fourth Embodiment

In the first embodiment, the configuration in which the ground-side power supply line detecting circuit 12 detects the ground-side power supply line has been described. In a fourth embodiment, a configuration in which a comparator detects a ground-side power supply line will be described.

The fourth embodiment will be described below by referring to the drawings. Note that, the same reference numerals are given to the components having the same functions as those described in the first embodiment, and the description thereof will be omitted.

Figure 7:
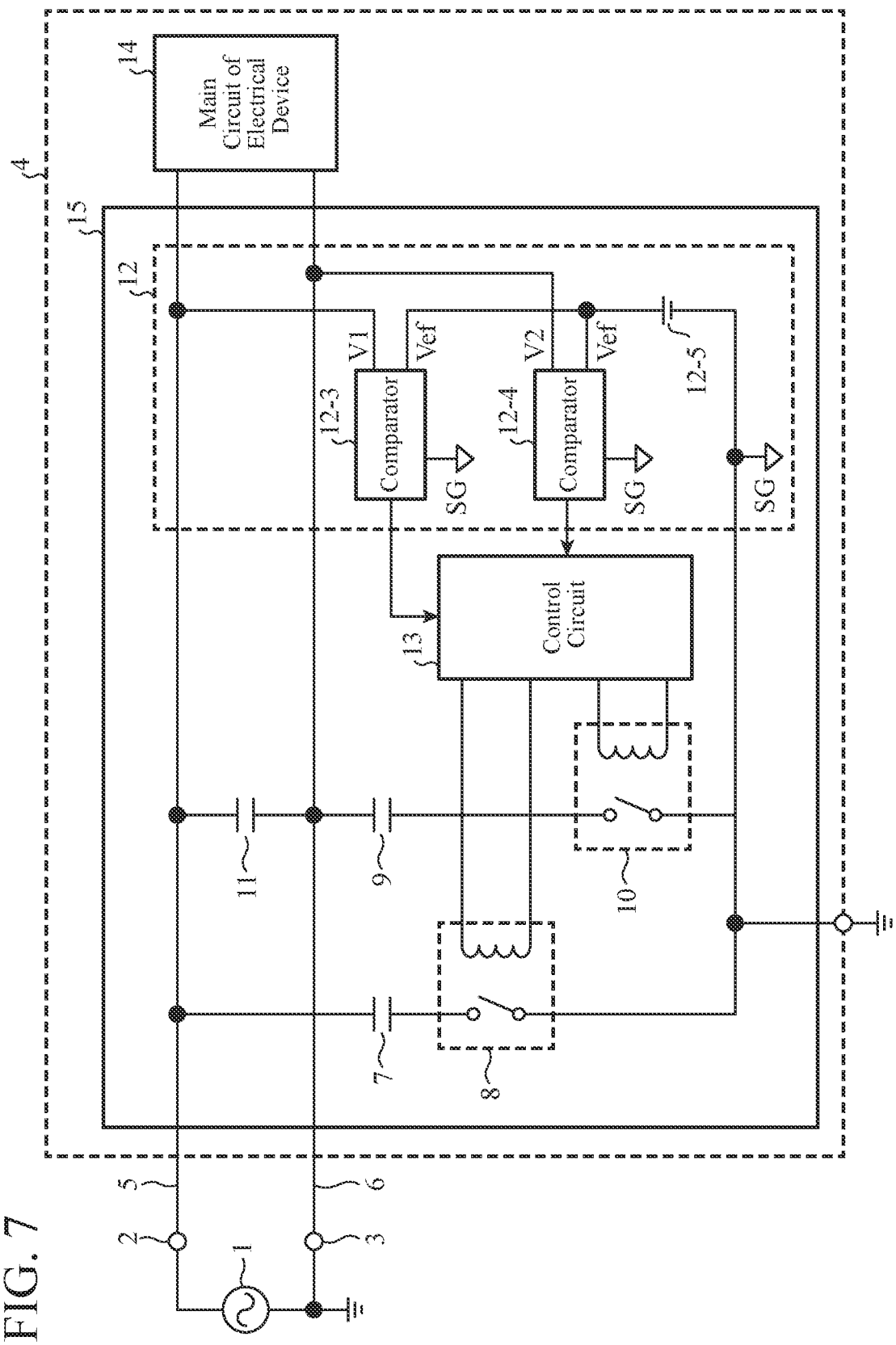
FIG. 7 is a block diagram illustrating a configuration of an electrical device according to a fourth embodiment.

FIG. 7 is a block diagram illustrating a configuration of an electrical device 4 according to the fourth embodiment. As illustrated in FIG. 7, a ground-side power supply line detecting circuit 12 of a noise filter 15 included in the electrical device 4 includes a comparator 12-3 and a comparator 12-4 (first comparator and second comparator), and a DC power supply 12-5.

The comparator 12-3 has an input terminal connected to each of the power supply line 5 and the DC power supply 12-5, an output terminal connected to the control circuit 13, and a ground terminal connected to a signal ground SG. The comparator 12-4 has an input terminal connected to each of the power supply line 6 and the DC power supply 12-5, an output terminal connected to the control circuit 13, and a ground terminal connected to the signal ground SG. A terminal of the DC power supply 12-5 which is not connected to the comparator 12-3 and the comparator 12-4 is connected to the signal ground SG. The signal ground SG is connected to the electrical device ground.

The ground-side power supply line detecting circuit 12 according to the fourth embodiment detects a result of comparing the voltage V1 between the power supply line and the signal ground SG with a voltage Vref between the DC power supply 12-5 and the signal ground SG, and detects a result of comparing the voltage V2 between the power supply line 6 and the signal ground SG with the voltage Vref between the DC power supply 12-5 and the signal ground SG. More specifically, in the fourth embodiment, in the ground-side power supply line detecting circuit 12, the comparator 12-3 detects a result of comparing the voltage V1 between the power supply line 5 and the signal ground SG with the voltage Vref between the DC power supply 12-5 and the signal ground SG, and the comparator 12-4 detects a result of comparing the voltage V2 between the power supply line 6 and the signal ground SG with the voltage Vref between the DC power supply 12-5 and the signal ground SG. The Vref is set to a value smaller than the amplitude of the power supply voltage of the AC power supply 1.

The comparator 12-3 outputs a signal 1 to the control circuit 13 when the voltage V1 between the power supply line 5 and the signal ground SG is equal to or more than the voltage Vref between the DC power supply 12-5 and the signal ground SG. The comparator 12-4 outputs a signal 2 to the control circuit 13 when the voltage V2 between the power supply line 6 and the signal around SG is equal to or more than the voltage Vref between the DC power supply 12-5 and the signal ground SG.

The control circuit 13 according to the fourth embodiment determines whether the power supply line (ground-side power supply line) connected to the electrode 3 is the power supply line 5 or the power supply line 6 from the comparison result between the voltage V1 and the voltage Vref detected by the ground-side power supply line detecting circuit 12 and the comparison result between the voltage V2 and the voltage Vref. More specifically, in the fourth embodiment, the control circuit 13 makes the following determination on the basis of the presence or absence of detection (output) of the signal 1 by the comparator 12-3, the presence or absence of detection (output) of the signal 2 by the comparator 12-4, and the detection (output) times of the signal 1 and the signal 2 by the comparator 12-3 and the comparator 12-4 during a certain period of time.

(Condition 1)

(a) no detection of the signal 1 from the comparator 12-3 and detection of the signal 2 from the comparator 12-4; or (b) detection of the signal 1 from the comparator 12-3 and detection of the signal 2 from the comparator 12-4, and the detection time of the signal 2 is longer.

When (Condition 1) is satisfied, the control circuit 13 determines that the power supply line 5 is a power supply line connected to the electrode 3, (Condition 2)
(a) detection of the signal 1 from the comparator 12-3 and no detection of the signal 2 from the comparator 12-4, or
(b) detection of the signal 1 from the comparator 12-3 and detection of the signal 2 from the comparator 12-4, and the detection time of the signal 1 is longer.

When (Condition 2) is satisfied, the control circuit 13 determines that the power supply line 6 is a power supply line connected to the electrode 3.

When determining that the power supply line 5 is the power supply line connected to the electrode 3, the control circuit 13 controls the relay 8 to short-circuit between the Y capacitor 7 and the electrical device ground. When determining that the power supply line 6 is the power supply line connected to the electrode 3, the control circuit 13 controls the relay 10 to short-circuit between the Y capacitor 9 and the electrical device ground.

Figure 8:
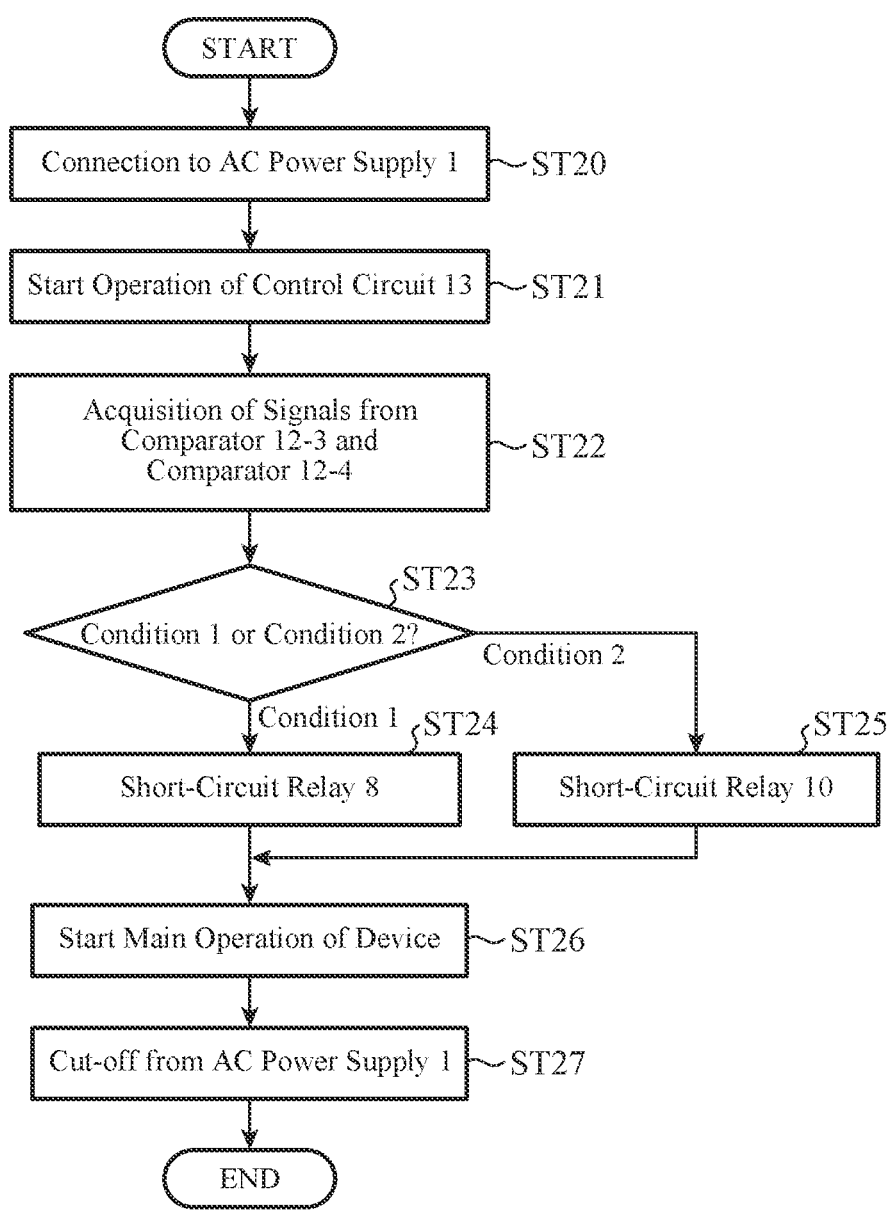
FIG. 8 is a flowchart illustrating a power supply line switching method by a noise filter according to the fourth embodiment.

Hereinafter, the operation of the noise filter 15 according to the fourth embodiment will be described with reference to the drawings. FIG. 8 is a flowchart illustrating a power supply line switching method by the noise filter 15 according to the fourth embodiment.

As illustrated in FIG. 8, the power supply line 5 is connected to one of the electrode 2 and the electrode 3, and the power supply line 6 is connected to the other of the electrode 2 and the electrode 3 (step ST20).

Next, the control circuit 13 starts the operation (step ST21).

Next, the comparator 12-3 detects a result of comparing the voltage V1 between the power supply line 5 and the signal ground SG with the voltage Vref between the DC power supply 12-5 and the signal ground SG. Next, the comparator 12-4 detects a result of comparing the voltage V2 between the power supply line 6 and the signal ground SG with the voltage Vref between the DC power supply 12-5 and the signal ground SG (step S122). The comparator 12-3 outputs a signal 1 to the control circuit 13 when the voltage V1 between the power supply line 5 and the signal ground SG is equal to or more than the voltage Vref between the DC power supply 12-5 and the signal ground SG. The comparator 12-4 outputs the signal 2 to the control circuit 13 when the voltage V1 between the power supply line 6 and the signal ground SG is equal to or more than the voltage Vref between the DC power supply 12-5 and the signal ground SG.

Next, the control circuit 13 determines which one of (Condition 1) and (Condition 2) is satisfied on the basis of the presence or absence of detection of the signal 1 by the comparator 12-3, the presence or absence of detection of the signal 2 by the comparator 12-4, and the detection times of the signal 1 and the signal 2 by the comparator 12-3 and the comparator 12-4 during a certain period of time (step ST23).

When determining that (Condition 1) is satisfied (Condition 1 in step ST23), the control circuit 13 controls the relay 8 to short-circuit between the Y capacitor 7 and the electrical device ground (step ST24).

When determining that (Condition 2) is satisfied (Condition 2 in step ST23), the control circuit 13 controls the relay 10 to short-circuit between the Y capacitor 9 and the electrical device ground (step S125).

As the next step of step ST24 or step ST25, the main circuit 14 of the electrical device starts the main operation of the electrical device 4 (step ST26).

Next, the main circuit 14 of the electrical device is cut off from the AC power supply 1 to stop the main operation of the electrical device 4 (step ST27). At this time, since the energization to the coil included in the relay 8 or the relay 10 is stopped, the connection between the Y capacitor 7 or the Y capacitor 9 and the electrical device ground is released.

The following effects can be obtained by the components and the operation of the noise filter 15 according to the fourth embodiment described above.

(Effect 1)

By using a comparator for the ground-side power supply line detecting circuit 12, the noise filter 15 can be implemented by an inexpensive component.

(Effect 2)

By using the comparator for the ground-side power supply line detecting circuit 12, even if the impulse noise is applied to the input of the comparator, the comparator only detects the impulse noise for a short time, and thus the comparison result between the voltage V1 or the voltage V2 and the voltage Vref is hardly affected.

The representative embodiment of the noise filter 15 has been described above. In addition to the configurations of the first to third embodiments, the following configuration may be further adopted. For example, a capacitor or the like may be inserted between the signal ground SG and the electrical device ground for the purpose of insulation or the like. The input unit of the comparator may be protected by resistance voltage division, a surge protection element, a diode, or the like. The comparator incorporated in the control circuit 13 may be used. In the fourth embodiment, an example in which voltages are compared by a comparator has been described, but a method of comparing currents by attaching a resistor to an input unit may be used. For the purpose of insulation or the like, a photocoupler, a pulse transformer, or the like may be inserted between the output unit of the comparator and the control circuit 13.

In the fourth embodiment, the ground-side power supply line detecting circuit 12 is configured by using two comparators. However, only one comparator may be used, and whether the one comparator is connected to the power supply line 5 or the power supply line 6 may be switched by a switch or the like. When both the signal 1 and the signal 2 are detected and the detection times are the same, the control circuit 13 may short-circuit only a predetermined relay.

In addition, in the fourth embodiment, one Y capacitor is inserted into each power supply line. Alternatively, two (or more) Y capacitors may be inserted into each power supply line. In this case, a relay may be inserted into all the Y capacitors, or one common relay may be inserted into the Y capacitors connected to the same power supply line.

As described above, the ground-side power supply line detecting circuit 12 in the noise filter 15 according to the fourth embodiment compares the first voltage V1 between the power supply line 5 and the electrical device ground with the threshold voltage Vref, and outputs a first signal when the first voltage V1 is equal to or more than the threshold voltage Vref, and compares the second voltage V2 between the power supply line 6 and the electrical device ground with the threshold voltage Vref, and outputs a second signal when the second voltage V2 is equal to or more than the threshold voltage Vref, and the control circuit 13, when the first signal is not output from the ground-side power supply line detecting circuit 12 and the second signal is output from the ground-side power supply line detecting circuit 12 during a certain period of time, or when the first signal and the second signal are output from the ground-side power supply line detecting circuit 12 and an output time of the second signal is longer than an output time of the first signal during a certain period of time, controls the relay 8 to short-circuit between the Y capacitor 7 and the electrical device ground, and when the first signal is output from the ground-side power supply line detecting circuit 12 and the second signal is not output from the ground-side power supply line detecting circuit 12 during a certain period of time, or when the first signal and the second signal are output from the ground-side power supply line detecting circuit 12 and an output time of the first signal is longer than an output tune of the second signal during a certain period of time, controls the relay 10 to short-circuit between the Y capacitor 9 and the electrical device ground.

According to the above configuration, it is possible to suitably determine whether the power supply line connected to the electrode 3 is the power supply line 5 or the power supply line 6 on the basis of the detected voltage. As a result, it is possible to short-circuit between the Y capacitor connected to the power supply line determined as the power supply line connected to the electrode 3 and the electrical device ground. That is, the power supply line connected to the Y capacitor can be appropriately, switched.

The ground-side power supply line detecting circuit 12 in the noise filter 15 according to the fourth embodiment includes the comparator 12-3, the comparator 12-4, and the DC power supply 12-5, the comparator 12-3 has an input terminal connected to each of the power supply line 5 and a positive terminal of the DC power supply 12-5, an output terminal connected to the control circuit 13, and a ground terminal connected to the electrical device ground, the comparator 12-4 has an input terminal connected to each of the power supply line 6 and a positive terminal of the DC power supply 12-5, an output terminal connected to the control circuit 13, and a ground terminal connected to the electrical device ground, the DC power supply 12-5 has a positive terminal connected to the input terminal of the comparator 12-3 and the input terminal of the comparator 12-4, and a negative terminal connected to the electrical device ground, the comparator 12-3 compares the first voltage V1 between the power supply line 5 and the electrical device ground with a threshold voltage Vref output from the DC power supply 12-5, and outputs the first signal from the output terminal when the first voltage V1 is equal to or more than the threshold voltage Vref, and the comparator 12-4 compares the second voltage V2 between the power supply line 6 and the electrical device ground with a threshold voltage Vref output from the DC power supply 12-5, and outputs the second signal from the output terminal when the second voltage V2 is equal to or more than the threshold voltage Vref.

According to the above configuration, the voltage between the power supply line and the electrical device ground can be suitably detected. Then, on the basis of the detected voltage, it is possible to suitably determine whether the power supply line connected to the electrode 3 is the power supply line 5 or the power supply line 6. As a result, it is possible to short-circuit between the Y capacitor connected to the power supply line determined as the power supply line connected to the electrode 3 and the electrical device ground. That is, the power supply line connected to the Y capacitor can be appropriately switched.

Fifth Embodiment

In the first embodiment, the configuration in which the ground-side power supply line detecting circuit 12 detects the ground-side power supply line has been described. In a fifth embodiment, a configuration in which a transistor detects a ground-side power supply line will be described.

Hereinafter, the fifth embodiment will be described with reference to the drawings, Note that, the same reference numerals are given to the components having the same functions as those described in the first embodiment, and the description thereof will be omitted.

Figure 9:
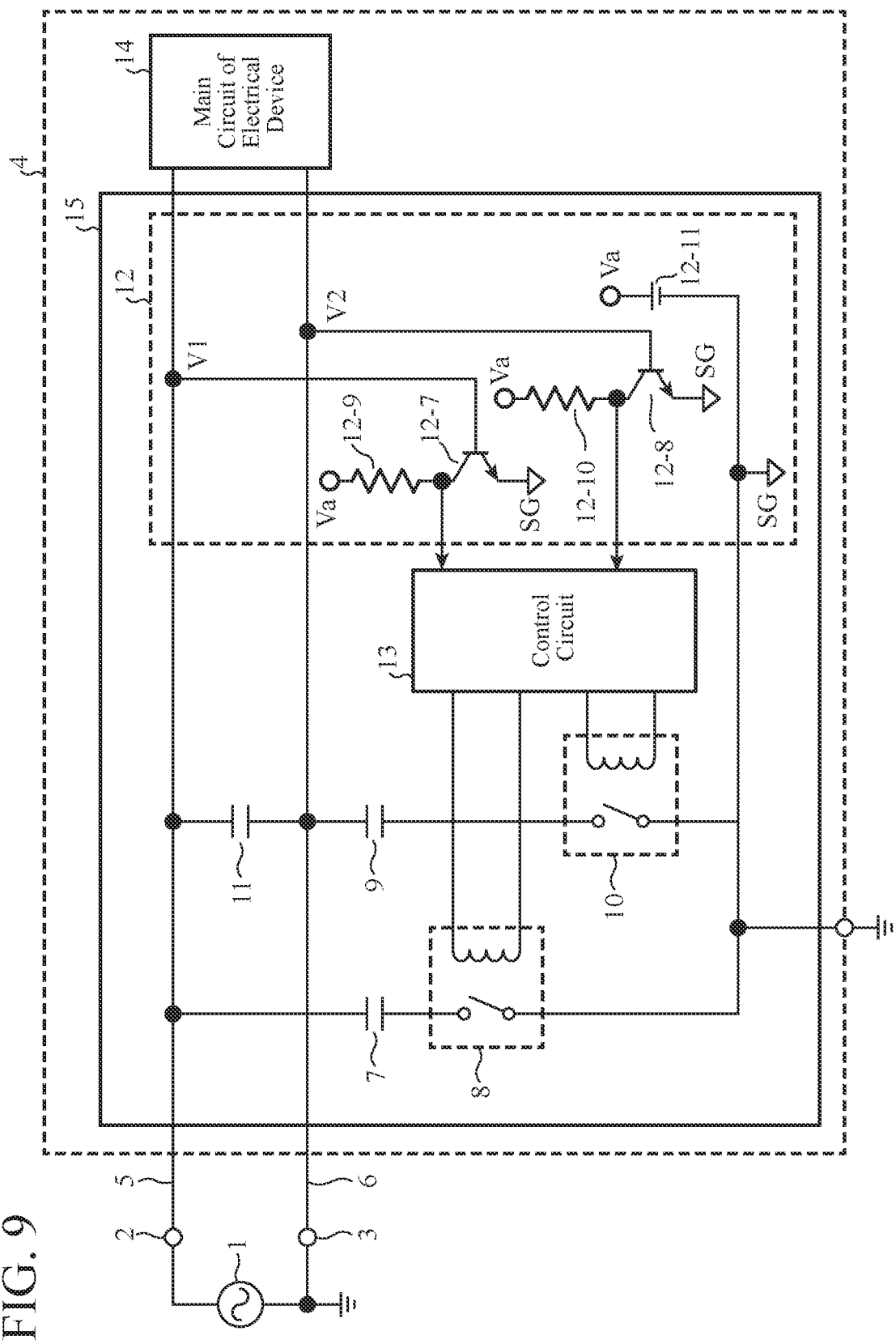
FIG. 9 is a block diagram illustrating a configuration of an electrical device according to a fifth embodiment.

FIG. 9 is a block diagram illustrating a configuration of an electrical device 4 according to the fifth embodiment. As illustrated in FIG. 9, a ground-side power supply line detecting circuit 12 of a noise filter 15 included in the electrical device 4 includes a transistor 12-7 and a transistor 12-8 (first transistor and second transistor), a resistor 12-9, a resistor 12-10, and a DC power supply 12-11. Note that in the fifth embodiment, a case where the transistor 12-7 and the transistor 12-8 are NPN transistors will be described as an example.

The transistor 12-7 has a base terminal connected to the power supply line 5, a collector terminal connected to the control circuit 13 and the resistor 12-9, and an emitter terminal connected to the signal ground SG. The terminal of the resistor 12-9 on the side not connected to the transistor 12-7 is connected to the DC power supply 12-11. The transistor 12-8 has a base terminal connected to the power supply line 6, a collector terminal connected to the control circuit 13 and the resistor 12-10, and an emitter terminal connected to the signal ground SG. The terminal of the resistor 12-10 on the side not connected to the transistor 12-8 is connected to the DC power supply 12-11. The terminal of the DC power supply 12-11 on the side not connected to the transistor 12-7 and the transistor 12-8 is connected to the signal ground SG. The signal ground SG is connected to the electrical device ground.

The ground-side power supply line detecting circuit 12 according to the fifth embodiment detects a result of comparing the voltage V1 applied between the power supply line 5 and the signal ground SG (between the base and emitter of the transistor 12-7) with the threshold voltage Vref of the transistor 12-7. Further, the around-side power supply line detecting circuit 12 according to the fifth embodiment detects a result of comparing the voltage V2 applied between the power supply line 6 and the signal ground SG (between the base and emitter of the transistor 12-8) with the threshold voltage Vref of the transistor 12-8.

Note that, in a case where the voltage V1 applied between the power supply line 5 and the signal ground SG is less than the threshold voltage Vref of the transistor 12-7, the transistor 12-7 enters an OFF state (a state in which a current hardly flows between the collector and emitter). When the voltage V1 applied between the power supply line 5 and the signal ground SG is equal to or more than the threshold voltage Vref of the transistor 12-7, the transistor 12-7 enters an ON state (a state in which a current easily flows between the collector and emitter). The threshold voltage Vref of the transistor 12-7 is set to a value smaller than the amplitude of the power supply voltage of the AC power supply 1.

Similarly, when the voltage V2 applied between the power supply line 6 and the signal ground SG is less than the threshold voltage Vref of the transistor 12-8, the transistor 12-8 enters an OFF state (a state in which a current hardly flows between the collector and emitter). When the voltage V2 applied between the power supply line 6 and the signal ground SG is equal to or more than the threshold voltage Vref of the transistor 12-8, the transistor 12-8 enters an ON state (a state in which a current easily flows between the collector and emitter). The threshold voltage Vref of the transistor 12-8 is set to a value smaller than the amplitude of the power supply voltage of the AC power supply 1.

The transistor 12-7 outputs the signal 1 to the control circuit 13 when the voltage V1 is equal to or more than the threshold voltage Vref. The transistor 12-8 outputs the signal 2 to the control circuit 13 when the voltage V2 is equal to or more than the threshold voltage Vref.

The control circuit 13 according to the fifth embodiment determines whether the power supply line (ground-side power supply line) connected to the electrode 3 is the power supply line 5 or the power supply line 6 from the comparison result between the voltage V1 detected by the ground-side power supply line detecting circuit 12 and the threshold voltage Vref and the comparison result between the voltage V2 and the threshold voltage Vref. More specifically, in the fifth embodiment, the control circuit 13 makes the following determination on the basis of the presence or absence of the detection (output) of the signal 1 by the transistor 12-7, the presence or absence of the detection (output) of the signal 2 by the transistor 12-8, and the detection (output) times of the signal 1 and the signal 2 by the transistor 12-7 and the transistor 12-8 during a certain period of time.
(Condition 1)
 (a) no detection of the signal 1 from the transistor 12-7 and detection of the signal 2 from the transistor 12-8; or
 (b) detection of the signal 1 from the transistor 12-7 and detection of the signal 2 from the transistor 12-8, and the detection time of the signal 2 is longer.

When (Condition) is satisfied, the control circuit 13 determines that the power supply line 5 is a power supply line connected to the electrode 3.
(Condition 2)
 (a) detection of the signal 1 from the transistor 12-7, and no detection of the signal 2 from the transistor 12-8, or
 (b) detection of the signal 1 from the transistor 12-7, and detection of the signal 2 from the transistor 12-8, and the detection time of the signal 1 is longer.

When (Condition 2) is satisfied, the control circuit 13 determines that the power supply line 6 is a power supply line connected to the electrode 3.

When determining that the power supply line 5 is the power supply line connected to the electrode 3, the control circuit 13 controls the relay 8 to short-circuit between the Y capacitor 7 and the electrical device ground. When determining that the power supply line 6 is the power supply line connected to the electrode 3, the control circuit 13 controls the relay 10 to short-circuit between the Y capacitor 9 and the electrical device ground.

Figure 10:
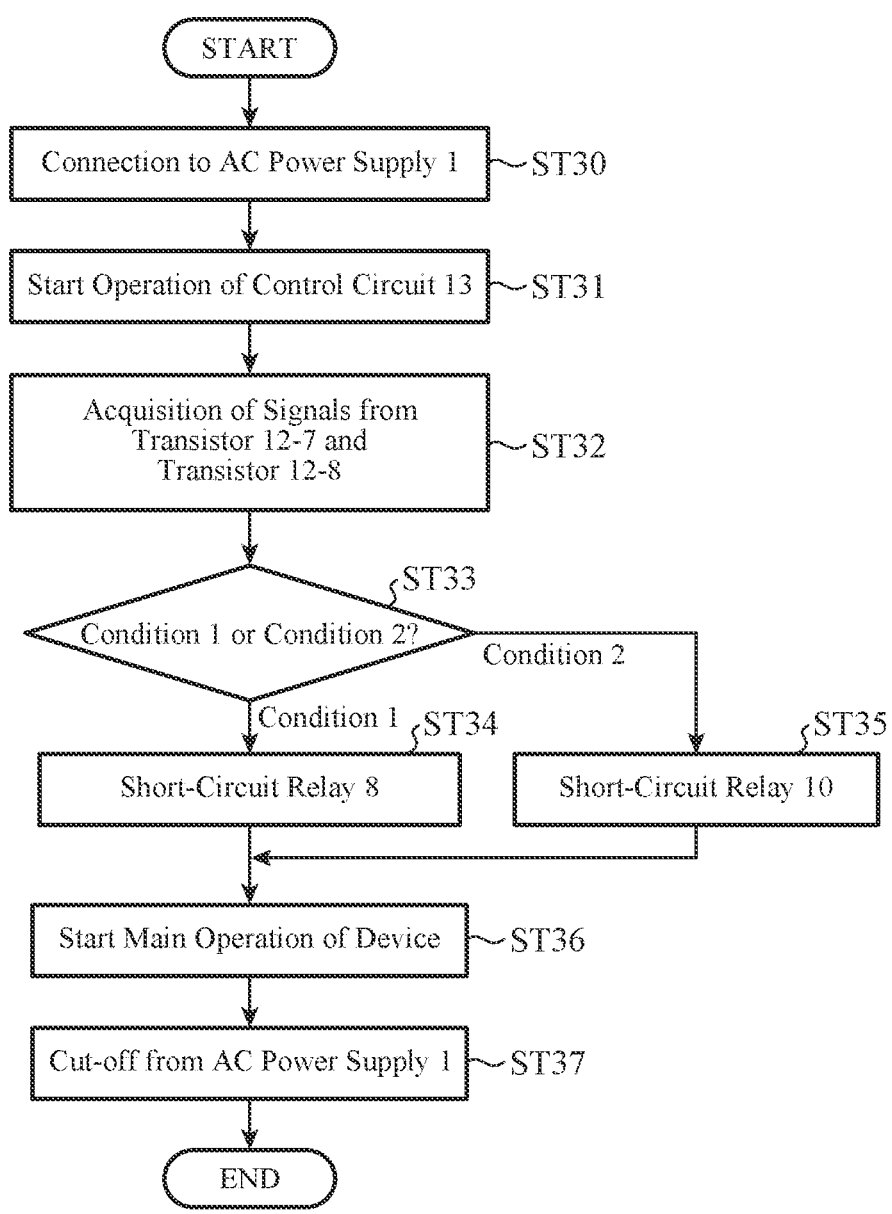
FIG. 10 is a flowchart illustrating a power supply line switching method by a noise filter according to the fifth embodiment.

Hereinafter, the operation of the noise filter 15 according to the fifth embodiment will be described with reference to the drawings. FIG. 10 is a flowchart illustrating a power supply line switching method by the noise filter 15 according to the fifth embodiment.

As illustrated in FIG. 10, the power supply line 5 is connected to one of the electrode 2 and the electrode 3, and the power supply line 6 is connected to the other of the electrode 2 and the electrode 3 (step ST30).

Next, the control circuit 13 starts the operation (step ST31).

Next, the transistor 12-7 detects a result of comparing the voltage V1 between the power supply line 5 and the signal ground SG (between the base and emitter) with the threshold voltage Vref. The transistor 12-8 detects a result of comparing the voltage V2 between the power supply line 6 and the signal ground SG (between the base and emitter) with the threshold voltage Vref (step ST32). The transistor 12-7 outputs the signal 1 to the control circuit 13 when the voltage V1 between the power supply line 5 and the signal ground SG is equal to or more than the threshold voltage Vref. The transistor 12-8 outputs the signal 2 to the control circuit 13 when the voltage V2 between the power supply line 6 and the signal ground SG is equal to or more than the threshold voltage Vref.

Next, the control circuit 13 determines which one of (Condition 1) and (Condition 2) is satisfied on the basis of the presence or absence of detection of the signal 1 by the transistor 12-7, the presence or absence of detection of the signal 21w the transistor 12-8, and the detection times of the signal 1 and the signal 2 by the transistor 12-7 and the transistor 12-8 during a certain period of time (step ST33).

When determining that (Condition 1) is satisfied (Condition 1 in step ST33), the control circuit 13 controls the relay 8 to short-circuit between the Y capacitor 7 and the electrical device ground (step S134).

When determining that (Condition 2) is satisfied (Condition 2 in step ST33), the control circuit 13 controls the relay 10 to short-circuit between the Y capacitor 9 and the electrical device ground (step ST35).

As the next step of step ST34 or step ST35, the main circuit 14 of the electrical device starts the main operation of the electrical device 4 (step ST36).

Next, the main circuit 14 of the electrical device is cut off from the AC power supply 1 to stop the main operation of the electrical device 4 (step S137). At this time, since the energization to the coil included in the relay 8 or the relay 10 is stopped, the connection between the Y capacitor 7 or the Y capacitor 9 and the electrical device ground is released.

The following effects can be obtained by the components and the operation of the noise filter 15 according to the fifth embodiment described above.
(Effect 1)

By using a transistor for the ground-side power supply line detecting circuit 12, the noise filter 15 can be implemented by an inexpensive component.
(Effect 2)

By using the transistor for the ground-side power supply line detecting circuit 12, even if the impulse noise is applied to the input of the transistor, the transistor only detects the impulse noise for a short time, so that the comparison result between the voltage V1 or the voltage V2 and the threshold voltage Vref is hardly affected.

The representative embodiment of the noise filter 15 has been described above. In addition to the configurations of the first to fourth embodiments, the following configuration may be further adopted. For example, the input unit of the transistor may be protected by current limitation by a resistor, resistance voltage division, a surge protection element, a diode, or the like. A resistor may be inserted in series to the base terminal, or a resistor may be inserted between the base and emitter. In the fifth embodiment, a case where the transistor is an NPN transistor has been described as an example. However, the ground-side power supply line detecting circuit 12 may be configured using a PNP transistor as long as a similar operation can be implemented. In addition, a field effect transistor or the like may be used instead of the transistor as long as the same operation can be implemented. In the Fifth embodiment, an example in which voltages are compared with each other by a transistor has been described, but a method in which a resistor is attached to an input unit to compare currents may be used. For the purpose of insulation or the like, a photocoupler, a pulse transformer, or the like may be inserted between the output unit of the transistor and the control circuit 13. In addition, in the fifth embodiment, the ground-side power supply line detecting circuit 12 is configured by using two transistors. However, only one transistor may be used, and whether the one transistor is connected to the power supply line 5 or the power supply line 6 may be switched by a switch or the like.

As described above, the ground-side power supply line detecting circuit 12 in the noise filter 15 according to the fifth embodiment includes the transistor 12-7, the transistor 12-8, the resistor 12-9, the resistor 12-10, and the DC power supply 12-11, the transistor 12-7 has a base terminal connected to the power supply line 5, a collector terminal connected to the control circuit 13 and one terminal of the resistor 12-9, and an emitter terminal connected to the electrical device ground, the transistor 12-8 has a base terminal connected to the power supply line 6, a collector terminal connected to the control circuit 13 and one terminal of the resistor 12-10, and an emitter terminal connected to the electrical device ground, the resistor 12-9 has one terminal connected to the collector terminal of the transistor 12-7, and the other terminal connected to the positive terminal of the DC power supply 12-11, and the resistor 12-10 has one terminal connected to the collector terminal of the transistor 12-8, and the other terminal connected to the positive terminal of the DC power supply 12-11, the DC power supply 12-11 has the positive terminal connected to the other terminal of the resistor 12-9 and the other terminal of the resistor 12-10, and the negative terminal connected to the electrical device ground, the transistor 12-7 compares the first voltage V1 applied between the base terminal and the emitter terminal with the threshold voltage Vref of the transistor 12-7, and outputs the first signal from the collector terminal when the first voltage V1 is equal to or more than the threshold voltage Vref of the transistor 12-7, and the transistor 12-8 compares the second voltage V2 applied between the base terminal and the emitter terminal with the threshold voltage Vref of the transistor 12-8, and outputs the second signal from the collector terminal when the second voltage V2 is equal to or more than the threshold voltage Vref of the transistor 12-8.

According to the above configuration, the voltage between the power supply line and the electrical device ground can be suitably detected. Then, on the basis of the detected voltage, it is possible to suitably determine whether the power supply line connected to the electrode 3 is the power supply line 5 or the power supply line 6. As a result, it is possible to short-circuit between the Y capacitor connected to the power supply line determined as the power supply line connected to the electrode 3 and the electrical device ground. That is, the power supply line connected to the Y capacitor can be appropriately switched.

Sixth Embodiment

In the first embodiment, the configuration in which the ground-side power supply line detecting circuit 12 detects the ground-side power supply line has been described. In a sixth embodiment, a configuration in which a photocoupler detects a ground-side power supply line will be described.

Hereinafter, the sixth embodiment will be described with reference to the drawings, Note that, the same reference numerals are given to the components having the same functions as those described in the first embodiment, and the description thereof will be omitted.

Figure 11:
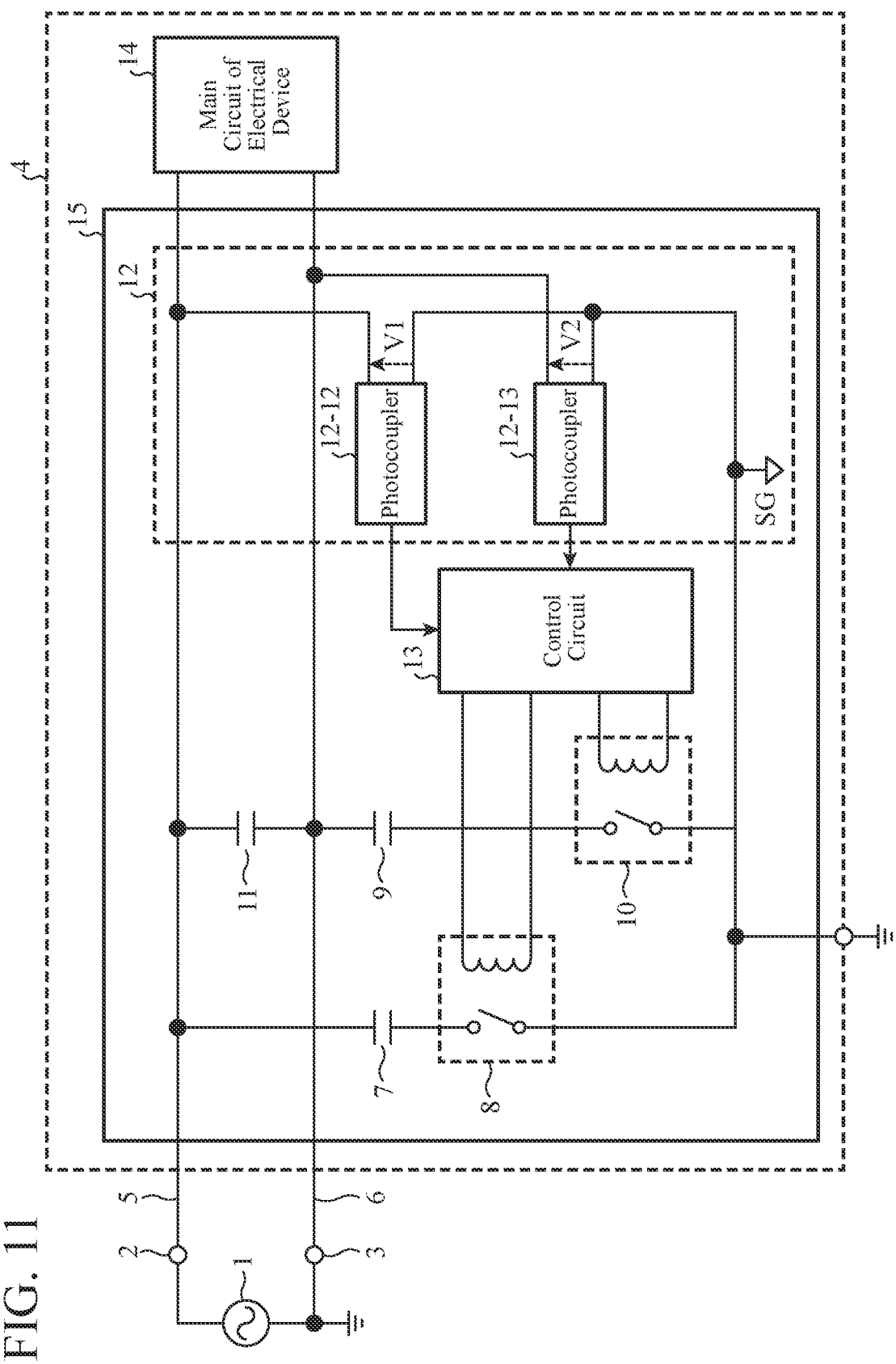
FIG. 11 is a block diagram illustrating a configuration of an electrical device according to a sixth embodiment.

FIG. 11 is a block diagram illustrating a configuration of an electrical device 4 according to the sixth embodiment. As illustrated in FIG. 11, a ground-side power supply line detecting circuit 12 of a noise filter 15 included in the electrical device 4 includes a photocoupler 12-12 and a photocoupler 12-13 (first photocoupler and second photocoupler). The photocoupler 12-12 has input terminals connected to the power supply line 5 and the signal ground SG, and an output terminal connected to the control circuit 13. The photocoupler 12-13 has input terminals connected to the power supply line 6 and the signal ground SG, and an output terminal connected to the control circuit 13. The signal ground SG is connected to the electrical device ground.

The ground-side power supply line detecting circuit 12 according to the sixth embodiment detects a result of comparing the voltage V1 between the power supply line and the signal ground SG with the threshold voltage Vref of the photocoupler 12-12, and detects a result of comparing the voltage V2 between the power supply line 6 and the signal ground SG with the threshold voltage Vref of the photocoupler 12-13. The Vref is set to a value smaller than the amplitude of the power supply voltage of the AC power supply 1.

The photocoupler 12-12 outputs a signal 1 to the control circuit 13 when the voltage V1 between the power supply line 5 and the signal ground SG is equal to or more than the threshold voltage Vref. The photocoupler 12-13 outputs a signal 2 to the control circuit 13 when the voltage V2 between the power supply line 6 and the signal ground SG is equal to or more than the threshold voltage Vref.

The control circuit 13 according to the sixth embodiment determines whether the power supply line (ground-side power supply line) connected to the electrode 3 is the power supply line 5 or the power supply line 6 from the comparison result between the voltage V1 detected by the ground-side power supply line detecting circuit 12 and the threshold voltage Vref and the comparison result between the voltage V2 and the threshold voltage Vref. More specifically, in the sixth embodiment; the control circuit 13 makes the following determination on the basis of the presence or absence of the detection (output) of the signal 1 by the photocoupler 12-12, the presence or absence of the detection (output) of the signal 2 by the photocoupler 12-13, and the detection (output) times of the signal 1 and the signal 2 by the photocoupler 12-12 and the photocoupler 12-13 during a certain period of time.

(Condition 1)
  (a) no detection of the signal 1 from the photocoupler 12-12 and detection of the signal 2 from the photocoupler 12-13; or
  (b) detection of the signal 1 from the photocoupler 12-12, and detection of the signal 2 from the photocoupler 12-13, and the detection time of the signal 2 is longer.

When (Condition 1) is satisfied the control circuit 13 determines that the power supply line 5 is a power supply line connected to the electrode 3.

(Condition 2)
  (a) detection of the signal 1 from the photocoupler 12-12 and no detection of the signal 2 from the photocoupler 12-13, or
  (b) detection of the signal 1 from the photocoupler 12-12 and detection of the signal 2 from the photocoupler 12-13; and the detection time of the signal 1 is longer.

When (Condition 2) is satisfied, the control circuit 13 determines that the power supply line 6 is a power supply line connected to the electrode 3.

When determining that the power supply line 5 is the power supply line connected to the electrode 3, the control circuit 13 controls the relay 8 to short-circuit between the Y capacitor 7 and the electrical device ground. When determining that the power supply line 6 is the power supply line connected to the electrode 3, the control circuit 13 controls the relay 10 to short-circuit between the Y capacitor 9 and the electrical device ground.

Figure 12:
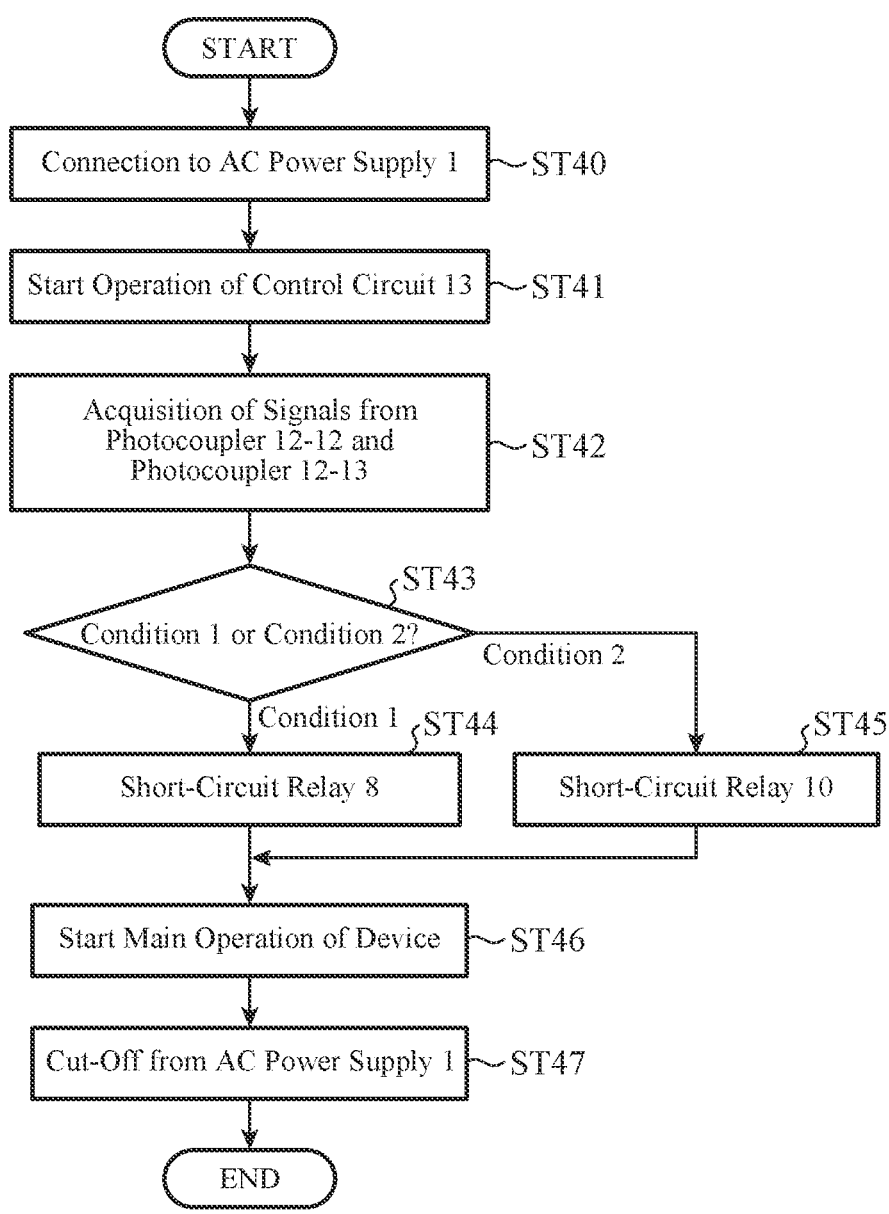
FIG. 12 is a flowchart illustrating a power supply line switching method by a noise filter according to the sixth embodiment.

Hereinafter, the operation of the noise filter 15 according to the sixth embodiment will be described with reference to the drawings. FIG. 12 is a flowchart illustrating a power supply line switching method by the noise filter 15 according to the sixth embodiment.

As illustrated in FIG. 12, the power supply line 5 is connected to one of the electrode 2 and the electrode 3, and the power supply line 6 is connected to the other of the electrode 2 and the electrode 3 (step ST40).

Next, the control circuit 13 starts the operation (step ST41).

Next, photocoupler 12-12 detects a result of comparing the voltage V1 between the power supply line 5 and the signal ground SG with the threshold voltage Vref. The photocoupler 12-13 detects a result of comparing the voltage V2 between the power supply line 6 and the signal ground. SG with the threshold voltage Vref (step ST42). The photocoupler 12-12 outputs the signal 1 to the control circuit 13 when the voltage V1 between the power supply line 5 and the signal ground SG is equal to or more than the threshold voltage Vref. The photocoupler 12-13 outputs the signal 2 to the control circuit 13 when the voltage V2 between the power supply line 6 and the signal ground SG is equal to or more than the threshold voltage Vref.

Next, the control circuit 13 determines which one of (Condition 1) and (Condition 2) described above is satisfied on the basis of the presence or absence of detection (output) of the signal 1 by the photocoupler 12-12, the presence or absence of detection (output) of the signal 2 by the photocoupler 12-13, and the detection (output) times of the signal 1 and the signal 2 by the photocoupler 1242 and the photocoupler 1243 during a certain period of time (step ST43).

When determining that (Condition 1) is satisfied (Condition 1 in step ST43), the control circuit 13 controls the relay 8 to short-circuit between the Y capacitor 7 and the electrical device ground (step S144).

When determining that (Condition 2) is satisfied (Condition 2 in step ST43), the control circuit 13 controls the relay 10 to short-circuit between the Y capacitor 9 and the electrical device ground (step ST45).

As the next step of step ST44 or step ST45, the main circuit 14 of the electrical device starts the main operation of the electrical device 4 (step ST46).

Next, the main circuit 14 of the electrical device is cut off from the AC power supply 1 to stop the main operation of the electrical device 4 (step ST47). At this time, since the energization to the coil included in the relay 8 or the relay 10 is stopped, the connection between the Y capacitor 7 or the Y capacitor 9 and the electrical device ground is released.

The following effects can be obtained by the components and the operation of the noise filter 15 according to the sixth embodiment described above.

(Effect 1)

By using a photocoupler for the ground-side power supply line detecting circuit 12, the noise filter 15 can be implemented by an inexpensive component.

(Effect 2)

By using a photocoupler for the ground-side power supply line detecting circuit 12, even if the impulse noise is applied to the input of the photocoupler, the photocoupler only detects the impulse noise for a short time, so that the comparison result between the voltage V1 or V2 and the threshold voltage Vref is hardly affected.

(Effect 3)

By using a photocoupler for the ground-side power supply line detecting circuit 12, insulation is enhanced.

The representative embodiment of the noise filter 15 has been described above. In addition to the configurations of the first to fifth embodiments, the following configuration may be further adopted. For example, the input unit of the photocoupler may be protected by a resistance voltage divider, a surge protection element, a diode, or the like. In order to prevent erroneous lighting of the photocoupler, a resistor may be attached between input terminals of the photocoupler. In the sixth embodiment, the voltage is compared by the photocoupler. Alternatively, the current may be compared by attaching a resistor to the input unit. In addition, in the sixth embodiment, the ground-side power supply line detecting circuit 12 includes two photocouplers. Alternatively, only one photocoupler may be provided, and a switch or the like may be used to switch which of the power supply line 5 and the power supply line 6 the one photocoupler is connected to.

As described above, the ground-side power supply line detecting circuit 12 in the noise filter 15 according to the sixth embodiment includes: the photocoupler 12-12 having an input terminal connected to each of the power supply line 5 and the electrical device ground, and an output terminal connected to the control circuit 13; and the photocoupler 12-13 having an input terminal connected to each of the power supply line 6 and the electrical device ground, and an output terminal connected to the control circuit 13, the photocoupler 12-12 compares the first voltage V1 between the power supply line 5 and the electrical device ground with the threshold voltage Vref of the photocoupler 12-12, and outputs the first signal from the output terminal when the first voltage V1 is equal to or more than the threshold voltage Vref of the photocoupler 12-12, and the photocoupler 12-13 compares the second voltage V2 between the power supply line 6 and the electrical device ground with the threshold voltage Vref of the photocoupler 12-13, and outputs the second signal from the output terminal when the second voltage V2 is equal to or more than the threshold voltage Vref of the photocoupler 12-13.

According to the above configuration, the voltage between the power supply line and the electrical device ground can be suitably detected. Then, on the basis of the detected voltage, it is possible to suitably determine whether the power supply line connected to the electrode 3 is the power supply line 5 or the power supply line 6. As a result, it is possible to short-circuit between the Y capacitor connected to the power supply line determined as the power supply line connected to the electrode 3 and the electrical device ground. That is, the power supply line connected to the Y capacitor can be appropriately switched.

Seventh Embodiment

In the second to sixth embodiments, the description has been given of the configuration in which the same circuit is inserted into each of the power supply line 5 and the power supply line 6 in the ground-side power supply line detecting circuit 12. In a seventh embodiment, a configuration in which a circuit is inserted only into the power supply line 5 will be described.

Hereinafter, the seventh embodiment will be described with reference to the drawings. Note that, the same reference numerals are given to the components having the same functions as those described in the first embodiment, and the description thereof will be omitted.

Figure 13:
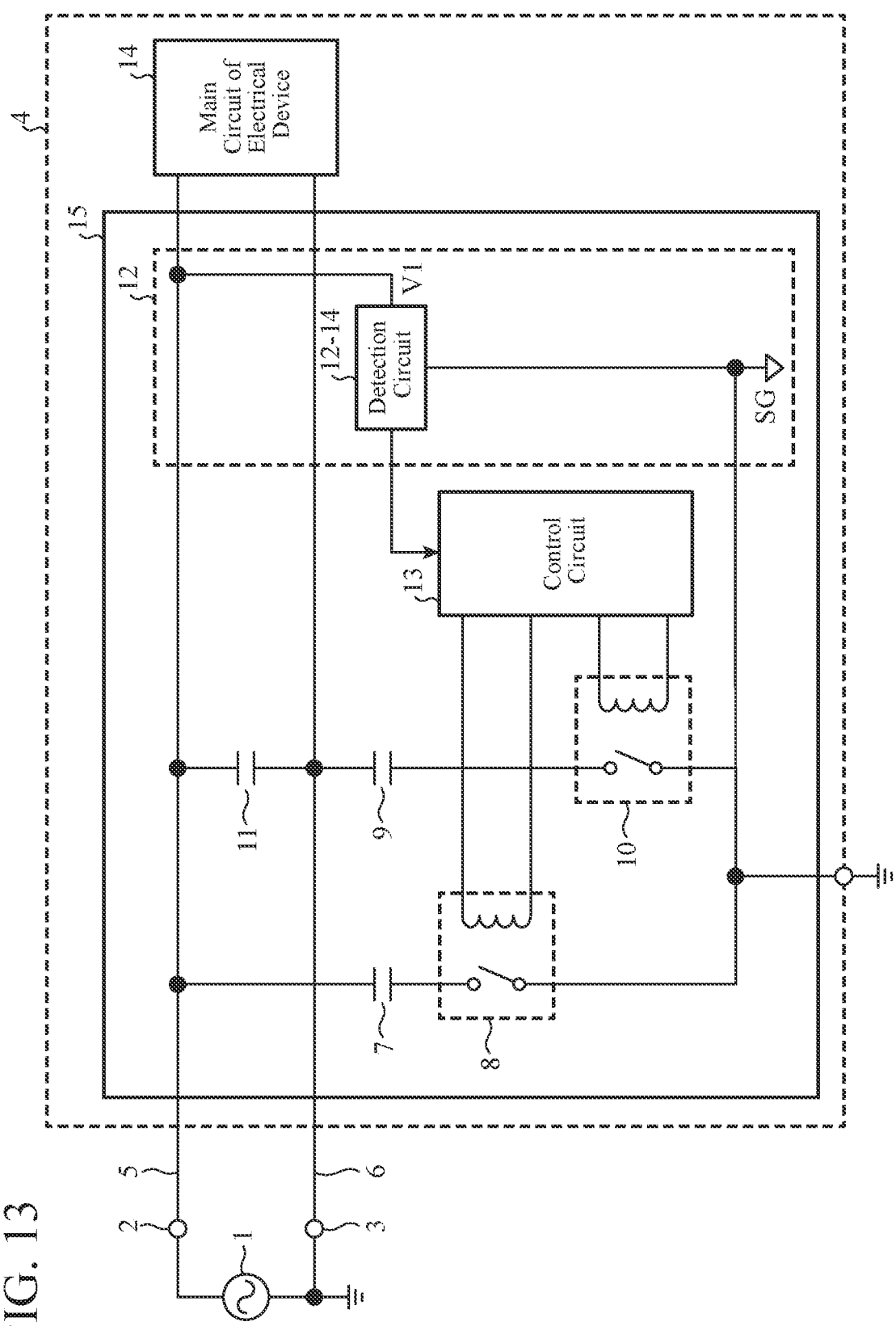
FIG. 13 is a block diagram illustrating a configuration of an electrical device according to seventh to ninth embodiments.

FIG. 13 is a block diagram illustrating a configuration of an electrical device 4 according to the seventh embodiment. As illustrated in FIG. 13, a ground-side power supply line detecting circuit 12 of a noise filter 15 included in the electrical device 4 includes a detection circuit 12-14. The detection circuit 12-14 is the A/D converter 12-1 according to the second embodiment. The detection circuit 12-14 has an input terminal connected to the power supply line 5, a ground terminal connected to the signal ground SG, and an output terminal connected to the control circuit 13. The signal ground SG is connected to the electrical device ground.

The ground-side power supply line detecting circuit 12 according to the seventh embodiment detects the voltage V1 between the power supply line 5 and the signal ground SG. More specifically, in the seventh embodiment, in the ground-side power supply line detecting circuit 12, the detection circuit 12-14 (AD converter 12-1) detects the voltage V1 between the power supply line 5 and the signal ground SG. The detection circuit 12-14 converts the detected voltage V1 into a digital signal and outputs the digital signal to the control circuit 13.

The control circuit 13 according to the seventh embodiment determines whether the power supply line (ground-side power supply line) connected to the electrode 3 is the power supply line 5 or the power supply line 6 on the basis of the amplitude of voltage V1 detected by the ground-side power supply line detecting circuit 12. More specifically, in the seventh embodiment, the control circuit 13 compares the voltage V1 detected by the detection circuit 12-14 (AD converter 12-1) with the threshold voltage Vref, and determines that the signal 1 is output from the detection circuit 12-14 when the voltage V1 is equal to or more than the threshold voltage Vref. The Vref is set to half the amplitude of the power supply voltage of the AC power supply 1.

When determining that the signal 1 is not output from the detection circuit 12-14 within a certain period of time, the control circuit 13 determines that the power supply line 5 is a power supply line connected to the electrode 3. When determining that the signal 1 is output from the detection circuit 12-14 within a certain period of time, the control circuit 13 determines that the power supply line 6 is a power supply line connected to the electrode 3.

When determining that the power supply line 5 is the power supply line connected to the electrode 3, the control circuit 13 controls the relay 8 to short-circuit between the Y capacitor 7 and the electrical device ground. When determining that the power supply line 6 is the power supply line connected to the electrode 3, the control circuit 13 controls the relay 10 to short-circuit between the Y capacitor 9 and the electrical device ground.

Figure 14:
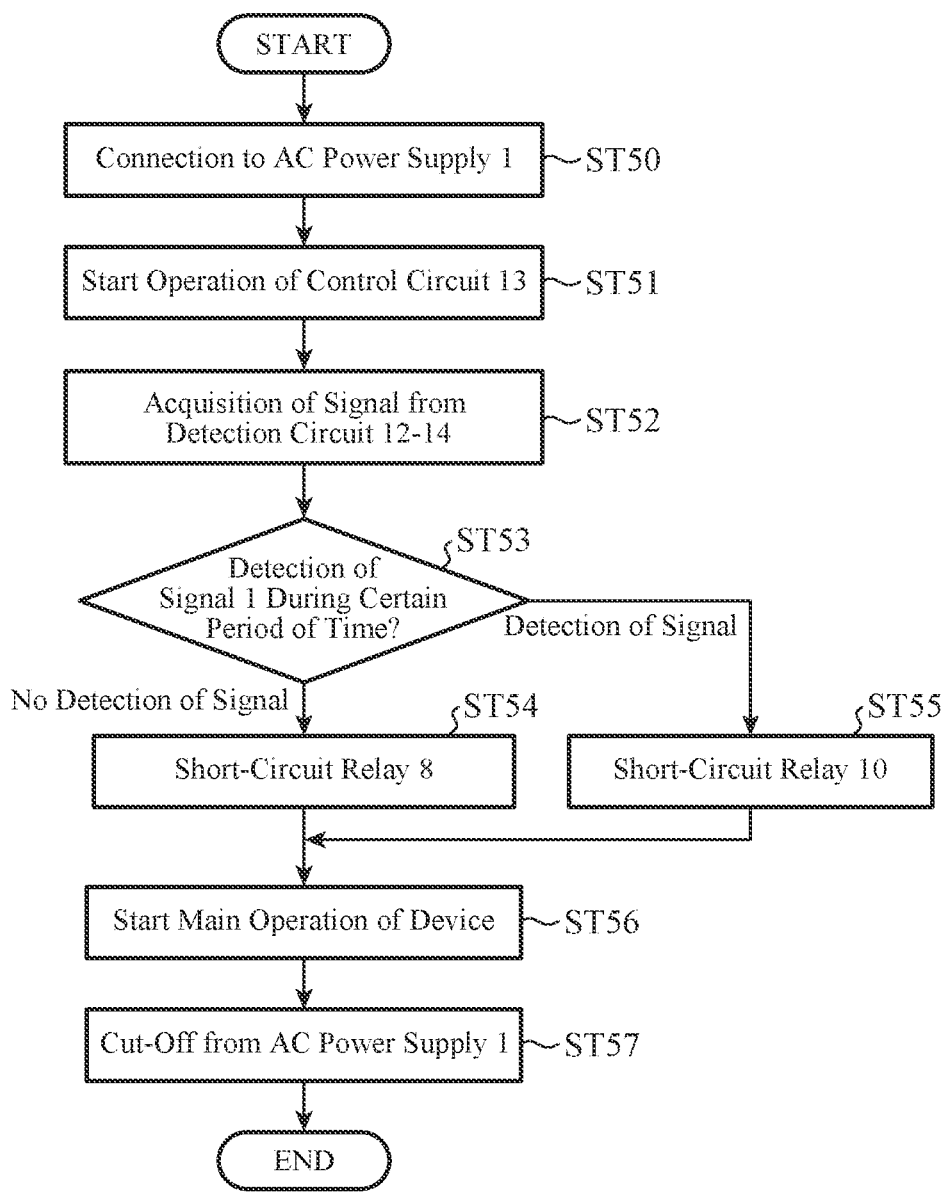
FIG. 14 is a flowchart illustrating a power supply line switching method by a noise filter according to the seventh to ninth embodiments.

Hereinafter, the operation of the noise filter 15 according to the seventh embodiment will be described with reference to the drawings, FIG. 14 is a flowchart illustrating a power supply line switching method by the noise Filter 15 according to the seventh embodiment.

As illustrated in FIG. 14, the power supply line 5 is connected to one of the electrode 2 and the electrode 3, and the power supply line 6 is connected to the other of the electrode 2 and the electrode 3 (step ST50).

Next, the control circuit 13 starts the operation (step ST51).

Next, the detection circuit 12-14 (A/D converter 12-1) detects a waveform of the voltage V1 between the power supply line 5 and the electrical device ground (step ST52).

The A/D converter 12-1 converts the detected voltage V1 into a digital signal and outputs the digital signal to the control circuit 13.

Next, the control circuit 13 determines whether or not the signal 1 has been output from the detection circuit 12-14 within a certain period of time (step ST53). More specifically, the control circuit 13 compares the voltage V1 detected by the detection circuit 12-14 with the threshold voltage Vref within a certain period of time, and determines that the signal 1 is output from the detection circuit 12-14 when the voltage V1 is equal to or more than the threshold voltage \ref.

If it is determined that the signal 1 has not been output from the detection circuit 12-14 within the certain period of time (NO in step ST53), the control circuit 13 controls the relay 8 to short-circuit between the Y capacitor 7 and the electrical device ground (step ST54).

When determining that the signal 1 is output from the detection circuit 12-14 within the certain period of time (YES in step ST53), the control circuit 13 controls the relay 10 to short-circuit between the Y capacitor 9 and the electrical device ground (step ST55).

As the next step of step ST54 or step ST55, the main circuit 14 of the electrical device starts the main operation of the electrical device 4 (step ST56).

Next, the main circuit 14 of the electrical device is cut off from the AC power supply 1 to stop the main operation of the electrical device 4 (step ST57). At this time, since the energization to the coil included in the relay 8 or the relay 10 is stopped, the connection between the Y capacitor 7 or the Y capacitor 9 and the electrical device ground is released.

The following effect can be obtained by the components and the operation of the noise filter 15 according to the seventh embodiment described above.

(Effect 1)

By providing only one detection circuit in the ground-side power supply line detecting circuit 12, the noise filter 15 can be implemented at low cost.

The representative embodiment of the noise filter 15 has been described above. In addition to the configurations of the first to sixth embodiments, the following configuration may be further adopted. For example, the input unit of the detection circuit may be protected by a resistance voltage divider, a surge protection element, a diode, or the like, in the seventh embodiment, the example in which the voltages are compared in the detection circuit has been described, but a method of attaching a resistor to the input unit and comparing the currents may be used. In the seventh embodiment, the example in which Vref is set to half the amplitude of the power supply, voltage of the AC power supply 1 has been described, but other values may be used as long as Fret is equal to or less than the amplitude of the power supply voltage of the AC power supply 1. In the seventh embodiment, the detection circuit is attached only to the power supply line 5. However, the detection circuit may be attached only to the power supply line 6.

As described above, the ground-side power supply line detecting circuit 12 in the noise filter 15 according to the seventh embodiment includes the detection circuit 12-14 (analog-to-digital converter 12-1) having an input terminal connected to the power supply line 5, a ground terminal connected to the electrical device ground, and an output terminal connected to the control circuit 13, and detecting the first voltage V1 between the power supply line 5 and the electrical device ground, the detection circuit 12-14 converts the detected first voltage V1 into a digital signal and outputs the digital signal to the control circuit 13, and the control circuit 13 compares the first voltage V1 detected by the detection circuit 12-14 with the threshold voltage Vref within the certain period of time, and controls the relay 8 to short-circuit between the Y capacitor 7 and the electrical device ground when the first voltage V1 does not reach or exceed the threshold voltage Vref within the certain period of time, and controls the relay 10 to short-circuit between the Y capacitor 9 and the electrical device ground when the first voltage V1 reaches or exceeds the threshold voltage Vref within the certain period of time.

According to the above configuration, it is possible to suitably determine whether the power supply line connected to the electrode 3 is the power supply line 5 or the power supply line 6 on the basis of the detected voltage. As a result, it is possible to short-circuit between the Y capacitor connected to the power supply line determined as the power supply line connected to the electrode 3 and the electrical device ground. That is, the power supply line connected to the V capacitor can be appropriately switched.

Eighth Embodiment

In the second to sixth embodiments, the description has been given of the configuration in which the same circuit is inserted into each of the power supply line 5 and the power supply line 6 in the ground-side power supply line detecting circuit 12. In an eighth embodiment, a configuration in which a circuit is inserted only into the power supply line 5 will be described.

Hereinafter, the eighth embodiment will be described with reference to the drawings, Note that, the same reference numerals are given to the components having the same functions as those described in the first embodiment, and the description thereof will be omitted.

A block diagram illustrating a configuration of an electrical device 4 according to the eighth embodiment is identical to that in FIG. 13. As illustrated in FIG. 13, a ground-side power supply line detecting circuit 12 of a noise filter 15 included in the electrical device 4 includes a detection circuit 12-14. The detection circuit 12-14 is the comparator 12-3 and the DC power supply 12-5 in the fourth embodiment. The detection circuit 12-14 has an input terminal connected to the power supply line 5, a ground terminal connected to the DC power supply 12-5, and an output terminal connected to the control circuit 13. A terminal of the DC power supply 12-5, which is not connected to the comparator 12-3, is connected to the signal ground SG. The signal ground SG is connected to the electrical device ground.

The ground-side power supply line detecting circuit 12 according to the eighth embodiment detects a result of comparing the voltage V1 between the power supply line and the signal ground SG with the voltage Vref between the DC power supply 12-5 and the signal ground SG. More specifically, in the eighth embodiment, in the ground-side power supply line detecting circuit 12, the detection circuit 12-14 detects a result of comparing the voltage V1 between the power supply line 5 and the signal ground SG with the voltage Vref between the DC power supply 12-5 and the signal ground SG. The Vref is set to a value smaller than the amplitude of the power supply voltage of the AC power supply 1. In the eighth embodiment, the voltage Vref between the DC power supply 12-5 and the signal ground SG is also referred to as a threshold voltage.

The detection circuit 12-14 outputs the signal 1 to the control circuit 13 when the voltage V1 between the power supply line 5 and the signal ground SG is equal to or more than the threshold voltage Vref.

The control circuit 13 according to the eighth embodiment determines whether the power supply line (ground-side power supply line) connected to the electrode 3 is the power supply line 5 or the power supply line 6 from the comparison result between the voltage V1 detected by the ground-side power supply line detecting circuit 12 and the threshold voltage Vref More specifically, in the eighth embodiment, when the signal 1 is not detected from the detection circuit 12-14 within a certain period of time, the control circuit 13 determines that the power supply line 5 is a power supply line connected to the electrode 3. When the signal 1 is detected from the detection circuit 12-14 within a certain period of time, the control circuit 13 determines that the power supply line 6 is a power supply line connected to the electrode 3.

When determining that the power supply line 5 is the power supply line connected to the electrode 3, the control circuit 13 controls the relay 8 to short-circuit between the Y capacitor 7 and the electrical device ground. When determining that the power supply line 6 is the power supply line connected to the electrode 3, the control circuit 13 controls the relay 10 to short-circuit between the V capacitor 9 and the electrical device ground.

Hereinafter, the operation of the noise filter 15 according to the eighth embodiment will be described with reference to the drawings. A flowchart illustrating the power supply line switching method by the noise filter 15 according to the eighth embodiment is the same as that in FIG. 14.

As illustrated in FIG. 14, the power supply line 5 is connected to one of the electrode 2 and the electrode 3, and the power supply line 6 is connected to the other of the electrode 2 and the electrode 3 (step ST50).

Next, the control circuit 13 starts operation (step ST51).

Next, the detection circuit 12-14 detects a result of comparing the voltage V1 between the power supply line 5 and the signal ground SG with the voltage (threshold voltage) Vref between the DC power supply 12-5 and the signal ground SG (step ST52). The detection circuit 12-14 outputs the signal 1 to the control circuit 13 when the voltage V1 between the power supply line 5 and the signal ground SG is equal to or more than the threshold voltage Vref.

Next, the control circuit 13 determines whether or not the signal 1 is detected (output) from the detection circuit 12-14 within a certain period of time (step ST53).

If the signal 1 is not detected from the detection circuit 12-14 within the certain period of time (NO in step ST53), the control circuit 13 controls the relay 8 to short-circuit between the Y capacitor 7 and the electrical device around (step ST54).

If the signal 1 is detected from the detection circuit 12-14 within the certain period of time (YES in step ST53), the control circuit 13 controls the relay 10 to short-circuit between the Y capacitor 9 and the electrical device ground (step ST55).

As the next step of step ST54 or step ST55, the main circuit 14 of the electrical device starts the main operation of the electrical device 4 (step ST56).

Next, the main circuit 14 of the electrical device is cut off from the AC power supply 1 to stop the main operation of the electrical device 4 (step ST57). At this time, since the energization to the coil included in the relay 8 or the relay 10 is stopped, the connection between the Y capacitor 7 or the Y capacitor 9 and the electrical device ground is released.

The following effect can be obtained by the components and the operation of the noise filter 15 according to the eighth embodiment described above.

(Effect 1)

By providing only one detection circuit in the ground-side power supply line detecting circuit 12, the noise filter 15 can be implemented at low cost.

The representative embodiment of the noise filter 15 has been described above. In addition to the configurations of the first to seventh embodiments, the following configuration may be further adopted. For example, the input unit of the detection circuit may be protected by a resistance voltage divider, a surge protection element, a diode, or the like. In the eighth embodiment, the example in which the voltages are compared in the detection circuit has been described, but a method of attaching a resistor to the input unit and comparing the currents may be used. In the eighth embodiment, the configuration in which the detection circuit is attached only to the power supply line 5 has been described, but the detection circuit may be attached only to the power supply line 6.

As described above, the ground-side power supply line detecting circuit 12 in the noise filter 15 according to the eighth embodiment includes the detection circuit 12-14 having an input terminal connected to the power supply line 5, a ground terminal connected to the electrical device ground, and an output terminal connected to the control circuit 13, and detecting the first voltage V1 between the power supply line 5 and the electrical device ground, the detection circuit 12-14 compares the first voltage V1 with the threshold voltage Vref, and outputs the first signal from the output terminal when the first voltage V1 is equal to or more than the threshold voltage Vref, and the control circuit 13 controls the relay 8 to short-circuit between the Y capacitor 7 and the electrical device ground when the first signal is not output from the detection circuit 12-14 within the certain period of time, and controls the relay 10 to short-circuit between the Y capacitor 9 and the electrical device ground when the first signal is output from the detection circuit 12-14 within the certain period of time.

According to the above configuration, it is possible to suitably determine whether the power supply line connected to the electrode 3 is the power supply line 5 or the power supply line 6 on the basis of the detected voltage. As a result, it is possible to short-circuit between the Y capacitor connected to the power supply line determined as the power supply line connected to the electrode 3 and the electrical device ground. That is, the power supply line connected to the Y capacitor can be appropriately switched.

Ninth Embodiment

In the second to sixth embodiments, the description has been given of the configuration in which the same circuit is inserted into each of the power supply line 5 and the power supply line 6 in the ground-side power supply line detecting circuit 12. In a ninth embodiment, a configuration in which a circuit is inserted only into the power supply line 5 will be described.

Hereinafter, the ninth embodiment will be described with reference to the drawings. Note that, the same reference numerals are given to the components having the same functions as those described in the first embodiment, and the description thereof will be omitted.

A block diagram illustrating a configuration of an electrical device 4 according to the ninth embodiment is identical to that in FIG. 13. As illustrated in FIG. 13, a ground-side power supply line detecting circuit 12 of a noise filter 15 included in the electrical device 4 includes a detection circuit 12-14. The detection circuit 12-14 is the transistor 12-7, the resistor 12-9, and the DC power supply 12-11 in the fifth embodiment, or the photocoupler 12-12 in the sixth embodiment. The detection circuit 12-14 has an input terminal connected to the power supply line 5, a ground terminal connected to the signal ground SG, and an output terminal connected to the control circuit 13. The signal around SG is connected to the electrical device ground.

The ground-side power supply line detecting circuit 12 according to the ninth embodiment detects a result of comparing the voltage V1 between the power supply line 5 and the signal ground SG, with the threshold voltage Vref of the detection circuit 12-14 (in particular, transistor 12-7 or photocoupler 12-12). The Vref is set to half the amplitude of the power supply voltage of the AC power supply 1.

The detection circuit 12-14 outputs the signal 1 to the control circuit 13 when the voltage V1 between the power supply line 5 and the signal ground SG is equal to or more than the threshold voltage Vref.

The control circuit 13 according to the ninth embodiment determines whether the power supply line (ground-side power supply line) connected to the electrode 3 is the power supply line 5 or the power supply line 6 from the comparison result between the voltage V1 detected by the ground-side power supply line detecting circuit 12 and the threshold voltage Vref More specifically, in the ninth embodiment, when the signal 1 is not detected from the detection circuit 12-14 within a certain period of time, the control circuit 13 determines that the power supply line 5 is a power supply line connected to the electrode 3. When the signal 1 is detected from the detection circuit 12-14 within a certain period of time, the control circuit 13 determines that the power supply line 6 is a power supply line connected to the electrode 3.

When determining that the power supply line 5 is the power supply line connected to the electrode 3, the control circuit 13 controls the relay 8 to short-circuit between the Y capacitor 7 and the electrical device ground. When determining that the power supply line 6 is the power supply line connected to the electrode 3, the control circuit 13 controls the relay 10 to short-circuit between the Y capacitor 9 and the electrical device ground.

Hereinafter, the operation of the noise filter 15 according to the ninth embodiment will be described with reference to the drawings. A flowchart illustrating a power supply line switching method by the noise filter 15 according to the ninth embodiment is the same as that in FIG. 14.

As illustrated in FIG. 14, the power supply line 5 is connected to one of the electrode 2 and the electrode 3, and the power supply line 6 is connected to the other of the electrode 2 and the electrode 3 (step ST50).

Next, the control circuit 13 starts the operation (step ST51).

Next, the detection circuit 12-14 detects a result of comparing the voltage V1 between the power supply line 5 and the signal around SG with the threshold voltage Vref (step ST52), The detection circuit 12-14 outputs the signal 1 to the control circuit 13 when the voltage V1 between the power supply line 5 and the signal ground SG is equal to or more than the threshold voltage Vref.

Next, the control circuit 13 determines whether or not the signal 1 is detected (output) from the detection circuit 12-14 within a certain period of time (step ST53).

If the signal 1 is not detected from the detection circuit 12-14 within the certain period of time (NO in step ST53), the control circuit 13 controls the relay 8 to short-circuit between the Y capacitor 7 and the electrical device ground (step ST54).

If the signal 1 is detected from the detection circuit 12-14 within the certain period of time (YES in step ST53), the control circuit 13 controls the relay 10 to short-circuit between the Y capacitor 9 and the electrical device ground (step ST55).

As the next step of step ST54 or step ST55, the main circuit 14 of the electrical device starts the main operation of the electrical device 4 (step ST55).

Next, the main circuit 14 of the electrical device is cut off from the AC power supply 1 to stop the main operation of the electrical device 4 (step ST57). At this time, since the energization to the coil included in the relay 8 or the relay 10 is stopped, the connection between the Y capacitor 7 or the capacitor 9 and the electrical device ground is released.

The following effect can be obtained by the components and the operation of the noise filter 15 according to the ninth embodiment described above.

(Effect 1)

By providing only one detection circuit in the ground-side power supply line detecting circuit 12, the noise filter 15 can be implemented at low cost.

The representative embodiment of the noise filter 15 has been described above. In addition to the configurations of the first to eighth embodiments, the following configuration may be further adopted. For example, the input unit of the detection circuit may be protected by a resistance voltage divider, a surge protection element, a diode, or the like. In the ninth embodiment, the example in which the voltages are compared in the detection circuit has been described, but a method of attaching a resistor to the input unit and comparing the currents may be used. In the ninth embodiment, an example in which Vref is set to half the amplitude of the power supply voltage of the AC power supply 1 has been described, but other values may be used as long as Vref is equal to or less than the amplitude of the power supply voltage of the AC power supply 1. In the ninth embodiment, the configuration in which the detection circuit is attached only to the power supply line 5 has been described, but the detection circuit may be attached only to the power supply line 6.

As described above, the ground-side power supply line detecting circuit 12 in the noise filter 15 according to the ninth embodiment includes the detection circuit 12-14 having an input terminal connected to the power supply line 5, a ground terminal connected to the electrical device ground, and an output terminal connected to the control circuit 13, and detecting the first voltage V1 between the power supply line 5 and the electrical device ground, the detection circuit 12-14 compares the first voltage V1 with the threshold voltage Vref, and outputs the first signal from the output terminal when the first voltage V1 is equal to or more than the threshold voltage Vref, and the control circuit 13 controls the relay 8 to short-circuit between the Y capacitor 7 and the electrical device ground when the first signal is not output from the detection circuit 12-14 within the certain period of time, and controls the relay 10 to short-circuit between the Y capacitor 9 and the electrical device ground when the first signal is output from the detection circuit 12-14 within the certain period of time.

According to the above configuration, it is possible to suitably determine whether the power supply line connected to the electrode 3 is the power supply line 5 or the power supply line 6 on the basis of the detected voltage. As a result, it is possible to short-circuit between the Y capacitor connected to the power supply line determined as the power supply line connected to the electrode 3 and the electrical device ground. That is, the power supply line connected to the Y capacitor can be appropriately switched.

The functions of the ground-side power supply line detecting circuit 12 and the control circuit 13 of the noise filter 15 are implemented by a processing circuitry, That is, the ground-side power supply line detecting circuit 12 and the control circuit 13 of the noise filter 15 include a processing circuitry for executing the processing of each step illustrated in FIGS. 2, 4, 8, 10, 12, and 14. The processing circuitry may be dedicated hardware, or may be a central processing unit (CPU) that executes a program stored in a memory.

Figure 15A:
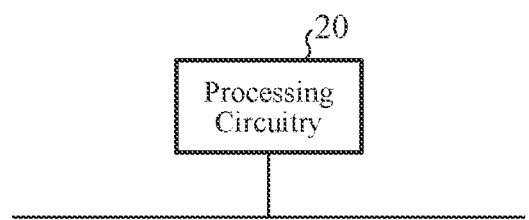
FIG. 15A is a block diagram illustrating a hardware configuration for implementing functions of an installation-side power supply line detecting circuit and a control circuit of a noise filter according to the first to ninth embodiments.
Figure 15B:
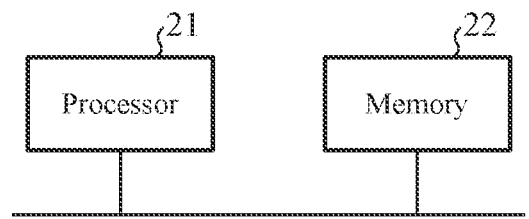
FIG. 15B is a block diagram illustrating a hardware configuration for executing software for implementing the functions of the installation-side power supply line detecting circuit and the control circuit of the noise filter according to the first to ninth embodiments.

FIG. 15A is a block diagram illustrating a hardware configuration that implements the functions of the ground-side power supply line detecting circuit 12 and the control circuit 13 of the noise filter 15. FIG. 15B is a block diagram illustrating a hardware configuration for executing software for implementing the functions of the ground-side power supply line detecting circuit 12 and the control circuit 13 of the noise filter 15.

In a case where the processing circuitry is a processing circuitry 20 of dedicated hardware illustrated in FIG. 15A, the processing circuitry 20 corresponds to, for example, a single circuit, a composite circuit, a programmed processor, a parallel programmed processor, an application specific integrated circuit (ASIC), a field-programmable gate array (FPGA), or a combination thereof.

The functions of the ground-side power supply line detecting circuit 12 and the control circuit 13 of the noise filter 15 may be implemented by separate processing circuits, or these functions may be collectively implemented by one processing circuitry.

When the processing circuitry is a processor 21 illustrated in FIG. 15B, the functions of the ground-side power supply line detecting circuit 12 and the control circuit 13 of the noise filter 15 are implemented by software, firmware, or a combination of software and firmware.

Note that the software or firmware is described as a program and stored in a Memory 22.

The processor 21 reads and executes the program stored in the memory 22, thereby implementing the functions of the ground-side power supply line detecting circuit 12 and the control circuit 13 of the noise filter 15. That is, the ground-side power supply line detecting circuit 12 and the control circuit 13 of the noise filter 15 include the memory 22 for storing a program that results in execution of the processing of each step illustrated in FIGS. 2, 4, 8, 10, 12, and 14 when each of these functions is executed by the processor 21.

These programs cause a computer to execute procedures or methods performed in the ground-side power supply line detecting circuit 12 and the control circuit 13 of the noise filter 15. The memory 22 may be a computer-readable storage medium storing a program for causing a computer to function as the ground-side power supply line detecting circuit 12 and the control circuit 13 of the noise filter 15.

The processor 21 corresponds to, for example, a central processing unit CPO, a processing device, an arithmetic device, a processor, a microprocessor, a microcomputer, a digital signal processor (DSP), or the like.

The memory 22 corresponds to, for example, a nonvolatile or volatile semiconductor memory such as a random access memory (RAM), a read only memory (ROM), a flash memory, an erasable programmable read only memory (EPROM), or an electrically-EPROM (EEPROM), a magnetic disk such as a hard disk or a flexible disk, a flexible disk, an optical disk, a compact disk, a mini disk, a compact disc (CD), a digital versatile disc (DVD), or the like.

A part of the functions of the ground-side power supply line detecting circuit 12 and the control circuit 13 of the noise filter 15 may be implemented by dedicated hardware, and a part thereof may be implemented by software or firmware.

For example, the function of the ground-side power supply line detecting circuit 12 is implemented by a processing circuitry as dedicated hardware. The function of the control circuit 13 may be implemented by the processor 21 reading and executing a program stored in the memory 22.

As described above, the processing circuitry can implement each of the above-described functions by hardware, software, firmware, or a combination thereof.

Note that it is possible to freely combine the individual embodiments, to modify arbitrary components of the individual embodiments, or to omit arbitrary components in the individual embodiments.

INDUSTRIAL APPLICABILITY

The noise filter according to the present disclosure can appropriately switch the power supply line connected to the Y capacitor, and thus can be used in an electrical device.

REFERENCE SIGNS LIST

1: AC power supply, 2: Electrode, 3: Electrode, 4: Electrical device, 5: Power supply line, 6: Power supply line, 7: Y capacitor, 8: Relay, 9: Y Capacitor, 10: Relay, 11: X Capacitor, 12: Ground-side power supply line detecting circuit, 12-1: A/D converter, 12-2: A/D converter, 12-3: Comparator, 12-4: Comparator, 12-5: DC power supply, 12-7: Transistor, 12-8: Transistor, 12-9: Resistance, 12-10: Resistance, 12-11: DC power supply, 12-12: Photocoupler, 12-13: Photocoupler, 12-14: Detection circuit, 13: Control circuit, 14: Main circuit of electrical device, 15: Noise filter, 20: Processing circuitry, 21: Processor, 22: Memory

The invention claimed is:

1. A noise filter of an electrical device connected to an AC power supply having a first electrode connected to a power supply ground and a second electrode not connected to the power supply ground, the noise filter comprising:
  a first power supply line connected to one of the first electrode and the second electrode;
  a second power supply line connected to the other of the first electrode and the second electrode;
  a first Y capacitor connected to the first power supply line;
  a second Y capacitor connected to the second power supply line;
  a first relay connected between the first V capacitor and an electrical device ground;
  a second relay connected between the second Y capacitor and the electrical device ground;
  a ground-side power supply line detecting circuit that is connected to each of the first power supply line and the second power supply line, and detects a power supply line connected to the first electrode from among the first power supply line and the second power supply line; and
  a control circuit to determine whether a power supply line connected to the first electrode is the first power supply line or the second power supply line on a basis of a detection result by the ground-side power supply line detecting circuit, controls the first relay to short-circuit between the first Y capacitor and the electrical device ground when determining that the power supply line connected to the first electrode is the first power supply line, and controls the second relay to short-circuit between the second Y capacitor and the electrical device ground when determining that the power supply line connected to the first electrode is the second power supply line.

2. The noise filter according to claim 1, wherein
in a case where a capacitance value of each of the first Y capacitor and the second Y capacitor is C [F], an upper limit value of a leakage current in the noise filter is I [A], an angular frequency of the AC power supply is ω [rad/s], and a power supply voltage of the AC power supply is V [V] a capacitance value C [F] of each of the first Y capacitor and the second Y capacitor follows the following Formula (1)

$$C \geq \frac{I}{\omega \times V} \quad (1)$$

3. The noise filter according to claim 1, wherein
the ground-side power supply line detecting circuit detects a first voltage between the first power supply line and the electrical device ground and detects a second voltage between the second power supply line and the electrical device ground, and
the control circuit
  determines whether the power supply line connected to the first electrode is the first power supply line or the second power supply line by determining which of the amplitude of the first voltage and the amplitude of the second voltage detected by the ground-side power supply line detecting circuit is smaller,
  controls the first relay to short-circuit between the first Y capacitor and the electrical device ground when determining that the amplitude of the first voltage is smaller than the amplitude of the second voltage, and
  controls the second relay to short-circuit between the second Y capacitor and the electrical device ground when determining that the amplitude of the second voltage is smaller than the amplitude of the first voltage.

4. The noise filter according to claim 1, wherein
the ground-side power supply line detecting circuit detects a first voltage between the first power supply line and the electrical device ground and detects a second voltage between the second power supply line and the electrical device ground, and
the control circuit, when determining that the power supply line connected to the first electrode is the first power supply line, controls the first relay to short-circuit between the first Y capacitor and the electrical device ground at a timing when the first voltage detected by the ground-side power supply line detecting circuit reaches zero, and when determining that the power supply line connected to the first electrode is the second power supply line, controls the second relay to short-circuit between the second Y capacitor and the electrical device ground at a timing when the second voltage detected by the ground-side power supply line detecting circuit reaches zero.

5. The noise filter according to claim 3, wherein
the ground-side power supply line detecting circuit includes:

a first analog-to-digital converter to detect a voltage between the first power supply line and the electrical device ground; and
a second analog-to-digital converter to detect a voltage between the second power supply line and the electrical device ground.

6. The noise finer according to claim 4, wherein
the ground-side power supply line detecting circuit includes:
a first analog-to-digital converter to detect a voltage between the first power supply line and the electrical device ground; and
a second analog-to-digital converter to detect a voltage between the second power supply line and the electrical device ground.

7. The noise finer according to claim 1, wherein
the ground-side power supply line detecting circuit
compares a first voltage between the first power supply line and the electrical device ground with a threshold voltage, and outputs a first signal when the first voltage is equal to or more than the threshold voltage, and
compares a second voltage between the second power supply line and the electrical device ground with the threshold voltage, and outputs a second signal when the second voltage is equal to or more than the threshold voltage, and
the control circuit,
when the first signal is not output from the ground-side power supply line detecting circuit and the second signal is output from the ground-side power supply line detecting circuit during a certain period of time, or
when the first signal and the second signal are output from the ground-side power supply line detecting circuit and an output time of the second signal is longer than an output time of the first signal during a certain period of time,
controls the first relay to short-circuit between the first Y capacitor and the electrical device ground, and
when the first signal is output from the ground-side power supply line detecting circuit and the second signal is not output from the ground-side power supply line detecting circuit during a certain period of time, or
when the first signal and the second signal are output from the ground-side power supply line detecting circuit and an output time of the first signal is longer than an output time of the second signal during a certain period of time,
controls the second relay to short-circuit between the second Y capacitor and the electrical device ground.

8. The noise filter according to claim 7, wherein
the ground-side power supply line detecting circuit includes a first comparator, a second comparator, and a DC power supply,
the first comparator has an input terminal connected to each of the first power supply line and a positive terminal of the DC power supply, an output terminal connected to the control circuit, and a ground terminal connected to the electrical device ground,
the second comparator has an input terminal connected to each of the second power supply line and a positive terminal of the DC power supply, an output terminal connected to the control circuit, and a ground terminal connected to the electrical device ground,
the DC power supply has a positive terminal connected to the input terminal of the first comparator and the input terminal of the second comparator, and a negative terminal connected to the electrical device ground,
the first comparator compares the first voltage between the first power supply line and the electrical device ground with a threshold voltage output from the DC power supply, and outputs the first signal from the output terminal when the first voltage is equal to or more than the threshold voltage, and
the second comparator compares the second voltage between the second power supply line and the electrical device ground with a threshold voltage output from the DC power supply, and outputs the second signal from the output terminal when the second voltage is equal to or more than the threshold voltage.

9. The noise filter according to claim 7, wherein
the ground-side power supply line detecting circuit includes a first transistor, a second transistor, a first resistor, a second resistor, and a DC power supply,
the first transistor has a base terminal connected to the first power supply line, a collector terminal connected to the control circuit and one terminal of the first resistor, and an emitter terminal connected to the electrical device ground,
the second transistor has a base terminal connected to the second power supply line, a collector terminal connected to the control circuit and one terminal of the second resistor, and an emitter terminal connected to the electrical device ground,
the first resistor has one terminal connected to the collector terminal of the first transistor, and the other terminal connected to a positive terminal of the DC power supply,
the second resistor has one terminal connected to the collector terminal of the second transistor, and the other terminal connected to a positive terminal of the DC power supply,
the DC power supply has a positive terminal connected to the other terminal of the first resistor and the other terminal of the second resistor, and a negative terminal connected to the electrical device ground,
the first transistor compares the first voltage applied between the base terminal and the emitter terminal with a threshold voltage of the first transistor, and outputs the first signal from the collector terminal when the first voltage is equal to or more than the threshold voltage of the first transistor, and
the second transistor compares the second voltage applied between the base terminal and the emitter terminal with a threshold voltage of the second transistor, and outputs the second signal from the collector terminal when the second voltage is equal to or more than the threshold voltage of the second transistor.

10. The noise filter according to claim 7, wherein
the ground-side power supply line detecting circuit includes:
a first photocoupler having an input terminal connected to each of the first power supply line and the electrical device ground, and an output terminal connected to the control circuit; and
a second photocoupler having an input terminal connected to each of the second power supply line and the electrical device ground, and an output terminal connected to the control circuit,
the first photocoupler compares the first voltage between the first power supply line and the electrical device ground with a threshold voltage of the first photocoupler, and outputs the first signal from an output terminal when the first voltage is equal to or more than the threshold voltage of the first photocoupler, and the second photocoupler compares the second voltage between the second power supply line and the electrical device ground with a threshold voltage of the second photocoupler, and outputs the second signal from an output terminal when the second voltage is equal to or more than the threshold voltage of the second photocoupler.

11. The noise filter according to claim 1, wherein the ground-side power supply line detecting circuit includes an analog-to-digital converter having an input terminal connected to the first power supply line, a ground terminal connected to the electrical device ground, and an output terminal connected to the control circuit, and detecting a first voltage between the first power supply line and the electrical device around, the analog-to-digital converter converts the detected first voltage into a digital signal and outputs the digital signal to the control circuit, and the control circuit compares the first voltage detected by the analog-to-digital converter with a threshold voltage within a certain period of time, and controls the first relay to short-circuit between the first Y capacitor and the electrical device ground when the first voltage does not reach or exceed the threshold voltage within the certain period of time, and controls the second relay to short-circuit between the second Y capacitor and the electrical device ground when the first voltage reaches or exceeds the threshold voltage within the certain period of time.

12. The noise filter according to claim 1, wherein the ground-side power supply line detecting circuit includes a detection circuit having an input terminal connected to the first power supply line, a ground terminal connected to the electrical device ground, and an output terminal connected to the control circuit, and detecting a first voltage between the first power supply line and the electrical device ground, the detection circuit compares the first voltage with a threshold voltage, and outputs a first signal from the output terminal when the first voltage is equal to or more than the threshold voltage, and the control circuit controls the first relay to short-circuit between the first Y capacitor and the electrical device ground when the first signal is not output from the detection circuit within a certain period of time, and controls the second relay to short-circuit between the second Y capacitor and the electrical device ground when the first signal is output from the detection circuit within a certain period of time.

* * * * *